United States Patent
Nasu et al.

(10) Patent No.: US 6,807,208 B2
(45) Date of Patent: Oct. 19, 2004

(54) LASER MODULE

(75) Inventors: Hideyuki Nasu, Tokyo (JP); Takehiko Nomura, Tokyo (JP); Tatsuhiko Ueki, Tokyo (JP); Mamoru Shimada, Tokyo (JP); Yuji Hiratani, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/224,496

(22) Filed: Aug. 21, 2002

(65) Prior Publication Data

US 2003/0058907 A1 Mar. 27, 2003

(30) Foreign Application Priority Data

Aug. 22, 2001 (JP) ............................. 2001-252094
Mar. 4, 2002 (JP) ............................. 2002-057043
Mar. 13, 2002 (JP) ............................. 2002-068474

(51) Int. Cl.[7] ........................................... H01S 3/04
(52) U.S. Cl. ................................ 372/36; 372/34
(58) Field of Search ................................ 372/34, 36

(56) References Cited

U.S. PATENT DOCUMENTS

| 5,068,865 | A | * | 11/1991 | Ohshima et al. | 372/36 |
| 5,265,113 | A | * | 11/1993 | Halldorsson et al. | 372/36 |
| 5,392,303 | A | * | 2/1995 | Shiozawa et al. | 372/34 |
| 5,644,584 | A | * | 7/1997 | Nam et al. | 372/36 |
| 5,781,573 | A | * | 7/1998 | Basu | 372/34 |
| 5,974,062 | A | * | 10/1999 | Yasuda et al. | 372/34 |
| 2002/0012369 | A1 | * | 1/2002 | Nasu et al. | 372/36 |

FOREIGN PATENT DOCUMENTS

| EP | 1 069 658 | 1/2001 |
| JP | 2000-561185 | 2/2000 |

OTHER PUBLICATIONS

U.S. patent application Ser. No. 10/032,612, filed Jan. 2, 2002, pending.
U.S. patent application Ser. No. 10/032,450, filed Jan. 2, 2002, pending.
U.S. patent application Ser. No. 10/229,032, filed Aug. 28, 2002, pending.

* cited by examiner

*Primary Examiner*—Don Wong
*Assistant Examiner*—James Menefee
(74) *Attorney, Agent, or Firm*—Oblon, Spivak, McClelland, Maier & Neustadt, P.C.

(57) ABSTRACT

An optical filter is provided on a first thermo-module whose temperature is controlled to be constant, via a base. Accordingly, a wavelength discrimination characteristic of the optical filter and an optical isolator can be stabilized, thereby realizing more accurate wavelength locking. Further, a second thermo-module is provided on the first thermo-module whose temperature is controlled to be constant. Accordingly, the temperature control range of the second thermo-module can be expanded, and hence the wavelength variable range of a semiconductor laser device provided on the second thermo-module via a base and a submount can be expanded.

47 Claims, 28 Drawing Sheets

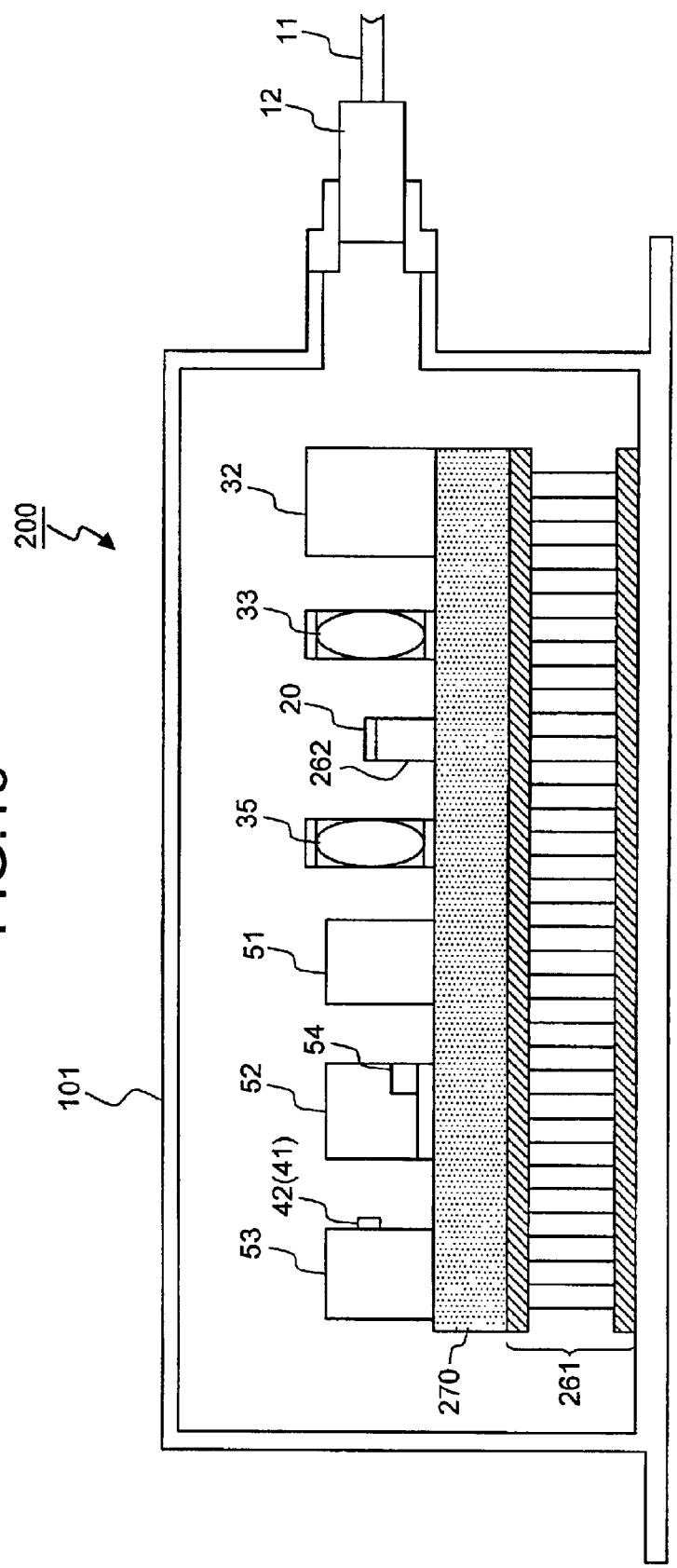

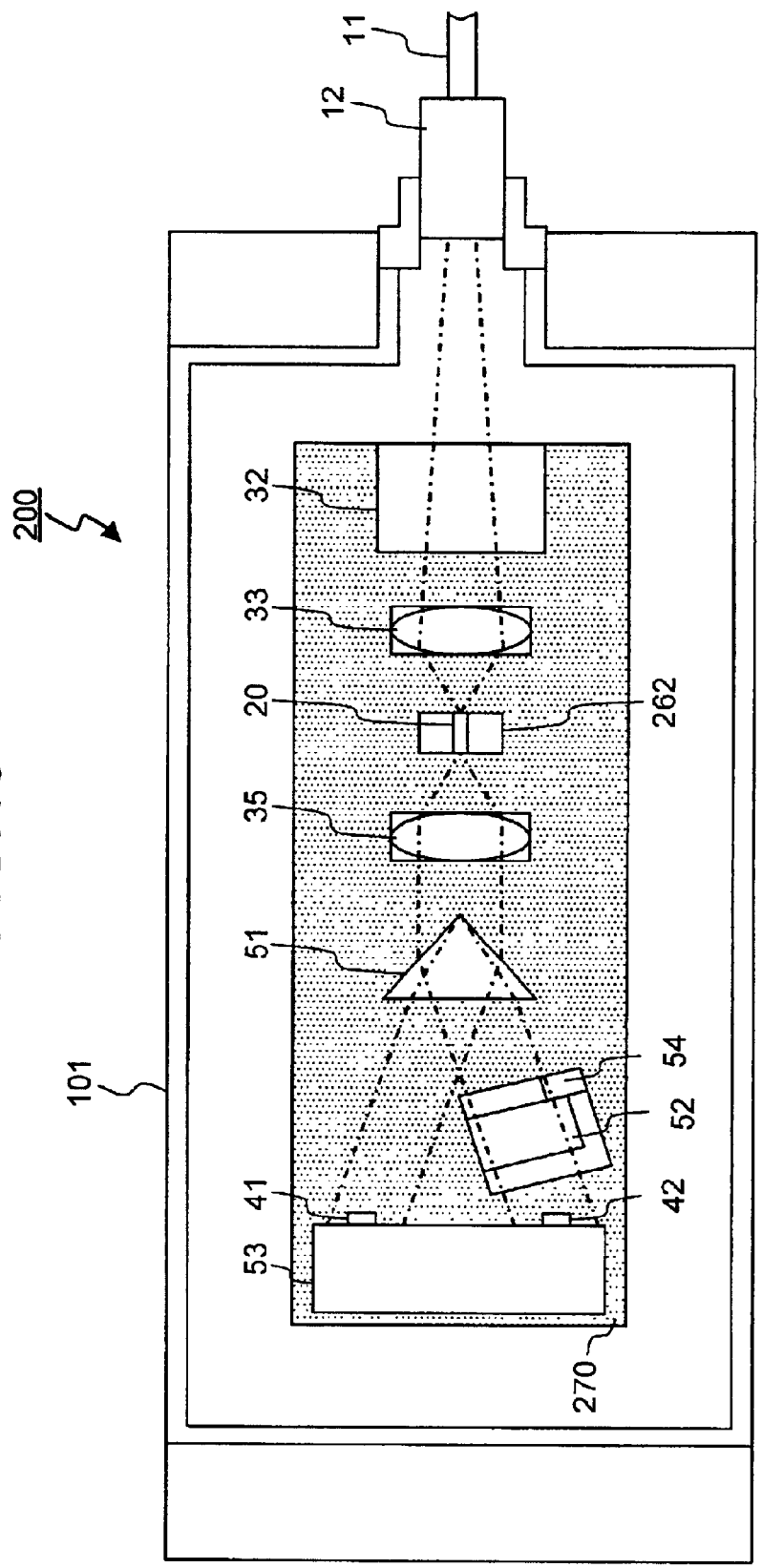

LASER MODULE

BACKGROUND OF THE INVENTION

1) Field of the Invention

The present invention relates to a semiconductor laser module used for an optical communication apparatus, and more specifically relates to a laser module for optical signal transmission or for a pump light source used for a wavelength division multiplexing system (WDM).

2) Description of the Related Art

Semiconductor laser devices can obtain a high laser output power by increasing an injected current, but the heat output from the device itself generally increases, in proportion to the injected current. The increased heat affects the properties of the semiconductor layer or optical parts which constitute the semiconductor laser device, causing various problems such that the wavelength of the laser actually output is deviated from a desired wavelength or the life of the device is shortened.

Particularly, in a semiconductor laser device used for dense WDM, it is required that the wavelength of the optical signal is stable for a long period of time, and hence it is necessary to accurately perform wavelength control. Therefore, a technique of providing a wavelength monitoring function in a laser module with the semiconductor laser device embedded therein has been well known.

FIG. 28 is a sectional side view of a conventional laser module in a laser outgoing direction. In FIG. 28, in a conventional laser module 300, a ferrule 12 for holding an optical fiber 11 is provided at an opening of a package 101, that is, in a light outgoing portion. On the bottom of the package 101, a first thermo-module 68 and a second thermo-module 69 are arranged close to each other. The first thermo-module 68 and the second thermo-module 69 are apparatus, the surface of which can be heated or cooled depending on the size and direction of the current to be passed, and are formed of a Peltier element or the like.

A base 30 formed of CuW or the like is arranged on the first thermo-module 68. On the top of the base, a submount 34 on which a semiconductor laser device 20 is mounted, a focusing lens 33 which focuses laser beams output from the front end face of the semiconductor laser device 20 onto an optical fiber 11, an optical isolator 32 which interrupts reflected return light from the optical fiber 11 side, and a collimator lens 35 which collimates the monitoring laser beams output from the rear end face of the semiconductor laser device 20, are provided. The portion including the base 30, the focusing lens 33, the submount 34, and the collimator lens 35 is referred to as a laser section.

On the other hand, a base 50 formed of CuW or the like is put on the second thermo-module 69, and on the top of the base, a prism 51 that splits the monitoring laser beams output from the rear end face of the semiconductor laser device 20 into two directions at a predetermined angle, an optical filter 52 to which one of the beams split by the prism 51 enters, and a submount 53, are provided. On the front face (a face in the laser outgoing direction) of the submount 53, a first optical detector 41 which receives the other of the beams split by the prism 51, and a second optical detector 42 which receives the beam passing through the optical filter 52 are provided on the same plane of the submount 53. A photo diode is used for the first optical detector 41 and the second optical detector 42.

A thermistor 54 that monitors the temperature of the optical filter 52 is provided near a portion where the prism 51 is fixed. The portion including the base 50 and each component provided on the base 50 is referred to as a wavelength monitoring section.

In this laser module 300 having the configuration, stable laser emission is realized by controlling the temperature of the first thermo-module 68 and the second thermo-module 69. The temperature control in this laser module 300 will be briefly explained below. The monitoring laser beam output from the rear end face of the semiconductor laser device 20 passes through the collimator lens 35, and the beam is split into two directions by the prism 51.

The one of the beams split by the prism 51 is converted into electric current by the first optical detector 41, and is used as a reference voltage in a not-shown current-voltage converter. The other of the beams split by the prism 51 passes through the optical filter 52, and the beam is converted into electric current by the second optical detector 42, and is used as a signal voltage in the not-shown current-voltage converter. The optical filter 52 has a property such that the transmission factor thereof is different with respect to the wavelength of the incident beams, and is formed of for example etalon. Therefore, when it is assumed that a difference between the signal voltage obtained with beams having a desired wavelength passing through the optical filter 52 and the reference voltage is a standard voltage difference, a wavelength deviation can be found by comparing the voltage difference between the actual reference voltage and the signal voltage with the standard voltage difference.

Since the wavelength deviation can be corrected by changing the temperature of the semiconductor laser device 20, the temperature of the submount 34 located below the semiconductor laser device 20 may be adjusted (cooled or heated) in order to correct the deviation. Therefore, a not-shown controller uses the voltage indicating the wavelength deviation obtained by the comparison as a control voltage for controlling the temperature of the first thermo-module 68, to operate the first thermo-module 68 as a temperature adjuster. As a result, the semiconductor laser device 20 is feedback controlled so that the temperature thereof is adjusted via the first thermo-module 68, the base 30, and the submount 34, to thereby suppress changes in the wavelength. That is, laser beams having a desired wavelength are output (hereinafter, this controlled state is referred to as wavelength locking).

However, since the optical filter 52 formed of etalon changes the property depending on the temperature, it is desirable to keep the temperature constant. Therefore, the not-shown controller calculates a difference between a desired temperature and the temperature detected by the thermistor 54, to control the temperature of the second thermo-module 69, designating the voltage corresponding to the difference as a control voltage. As a result, the optical filter 52 is heated or cooled via the second thermo-module 69 and the base 50, and stabilized at a desired temperature.

In the conventional laser module, however, since the temperature of the semiconductor laser device 20 is controlled by only the first thermo-module 68, there is a problem that a wavelength variable range, that is, a temperature variable range is not sufficient for realizing a so-called wavelength variable type laser module that selects the temperature of the semiconductor laser device 20 within a predetermined range and uses a laser beam having a wavelength emitted at the selected temperature. As the cause thereof, it can be considered that the cooling ability of the thermo-module unit is not sufficient, and the temperature of the package becomes high due to heat transmitted from the thermo-module.

Insufficient cooling ability of the thermo-module unit will be first explained. The temperature range that can be controlled in the normal thermo-module is about 60° C., and therefore, when temperature of from −5° C. to 70° C. are required as the temperature specification of the laser module package, the temperature variable range by the first thermo-module 68 becomes from 10° C. to 55° C., and hence it is possible to adjust the semiconductor laser device 20 in a range of about 45° C. The temperature dependency of the emission wavelength of the semiconductor laser device is determined by the material of the semiconductor, and it is known that the temperature dependency thereof is about 0.1 nm/° C. Therefore, in this example, the wavelength variable range becomes 0.1 nm/° C.×45° C.=4.5 nm. In this wavelength variable range, however, it is difficult to correspond to various applications having different emission wavelengths that are desired to use, and hence the practicality thereof is poor.

The problem that the temperature of the package becomes high will now be explained. In the thermo-module formed of an electric heat converter such as a Peltier device, heat transfer is realized only between the upper surface where the semiconductor laser device is mounted and the lower face. Therefore, sufficient cooling of the semiconductor laser device results in rise of the temperature on the lower face. Since the lower face of the thermo-module abuts against the bottom face of the package, the temperature rise thereof causes a temperature rise of the package. That is to say, the temperature inside the package increases due to the heat of the package itself, in addition to heat generation of a member to be cooled such as the semiconductor laser device. In the end, within the package of the laser module, such a heat cycle occurs that heat flows into the semiconductor laser device continuously, due to a convection current, radiation, and conduction (of these, mainly due to convection current). The thermo-module must absorb the heat continuously in order to keep the member to be cooled at a predetermined temperature. Therefore, the temperature range that can be actually controlled by the thermo-module becomes narrower than the temperature variable range that can be controlled by the original ability of the thermo-module.

Particularly, since the member to be cooled includes not only the semiconductor laser device but also optical members on the wavelength monitoring section, a thermo-module having a large cooling ability is required. The thermo-module having a larger cooling ability naturally produces a larger amount of heat on the lower face thereof when the cooling ability is exhibited to the maximum, and hence the amount of heat flowing into the semiconductor laser device from the package also increases. For example, when a heating value of the semiconductor laser device is about 0.1 W, the heat flowing into the member to be cooled from the package may exceed 1 W.

As a temperature difference between the package and the member to be cooled increases, heat flowing into the member to be cooled from the package also increases. Therefore, in the wavelength variable type laser module, if it is tried to expand the temperature control range of the semiconductor laser device towards the low temperature side in order to expand the wavelength variable range, the amount of heat flowing therein from the package increases many times as large as the heating value of the semiconductor laser device itself. Hence, the amount of heat to be absorbed by the thermo-module rapidly increases. Since the amount of heat that can be absorbed by the thermo-module is determined by the cooling ability of the thermo-module, the temperature range of the semiconductor laser device that can be controlled is inevitably limited, thereby causing a problem in that the wavelength variable range cannot be expanded. In the state that the temperature difference occurs, the power of the thermo-module required for cooling also increases.

When the heating value of the package, that is, the heating value of the laser module increases, heat dissipation to the air outside the package becomes difficult. This heat dissipation can be realized to some extent by providing a large fin for heat radiation in the laser module or equipment for optical communication including the laser module. However, existence of the large fin causes a new problem that the degree of integration of the laser module and other equipment is decreased.

It takes a long period of time of from tens of seconds to several minutes, until the semiconductor laser device becomes stable at a target temperature set by the thermo-module, mainly because the heat capacity of the member to be cooled is large. Hence, there is a problem that it is difficult to shift to stable emission operation within a short period of time, after activation of the laser module or after the wavelength is changed.

SUMMARY OF THE INVENTION

It is an object of the present invention to provide a laser module in which stable wavelength locking is possible by a wavelength monitor using an optical filter, and in which the variable range of an emission wavelength can be expanded by expanding the temperature control range of a semiconductor laser device.

It is another object of the present invention to provide a laser module that realizes expansion of the temperature controllable range of the semiconductor laser device, that is, expansion of the variable range of emission wavelength, as well as realizing low power consumption of a thermo-module and easy heat radiation, and also allows high-density packaging.

It is still another object of the present invention to provide a laser module that can shorten the time until reaching the stable operation, after activation of the laser module or after the wavelength is changed.

The laser module according to the present invention comprises a laser module having a first temperature adjuster and a second temperature adjuster provided on the first temperature adjuster, and also comprises a semiconductor laser device provided on the second temperature adjuster, and a wavelength monitoring section that is provided on the first temperature adjuster and detects a change in wavelength of a laser beam output from the semiconductor laser device. According to this invention, the wavelength monitoring section is kept at a constant temperature to thereby stabilize the wavelength discrimination characteristic of various parts constituting the wavelength monitoring section, and the second temperature adjuster that controls the temperature of the laser section, is provided on the first temperature adjuster that is controlled at a constant temperature. As a result, the temperature variable range of the laser section can be expanded.

The laser module according to the present invention comprises a first temperature adjuster, a semiconductor laser device provided on the first temperature adjuster, a second temperature adjuster that heats the semiconductor laser device at a near place thereof, and a wavelength monitoring section that is provided on the first temperature adjuster and detects a change in wavelength of laser beams output from the semiconductor laser device. According to this invention, the semiconductor laser device can be heated, separately from the first temperature adjuster, by the second temperature adjuster such as a heater.

The laser module according to the present invention comprises a first temperature adjuster, a second temperature adjuster provided on the first temperature adjuster, a third temperature adjuster arranged side by side in isolation from the first temperature adjuster, a semiconductor laser device provided on the second temperature adjuster, and a wavelength monitoring section that is provided on the third temperature adjuster and detects a change in wavelength of a laser beam output from the semiconductor laser device. According to this invention, the wavelength monitoring section is kept at a constant temperature by the third temperature adjuster to thereby stabilize the wavelength discrimination characteristic of various parts constituting the wavelength monitoring section, and the second temperature adjuster that controls the temperature of the laser section is provided on the first temperature adjuster controlled at a constant temperature. As a result, the temperature variable range of the laser section can be expanded.

The laser module according to the present invention comprises a first temperature adjuster, a thermal conductor having high thermal conductivity provided on the first temperature adjuster, a second temperature adjuster provided on the thermal conductor, and a semiconductor laser device provided on the second temperature adjuster. According to this invention, the heat generated on the lower face of the second temperature adjuster for adjusting the temperature of the semiconductor laser device can be efficiently radiated over the whole surface of the first temperature adjuster, by the thermal conductor having high thermal conductivity.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 18 is a sectional side view of a laser module according to a seventh embodiment in a laser outgoing direction;

FIG. 19 is a sectional top view of the laser module according to the seventh embodiment in the laser outgoing direction;

DETAILED DESCRIPTION

Figure 1:
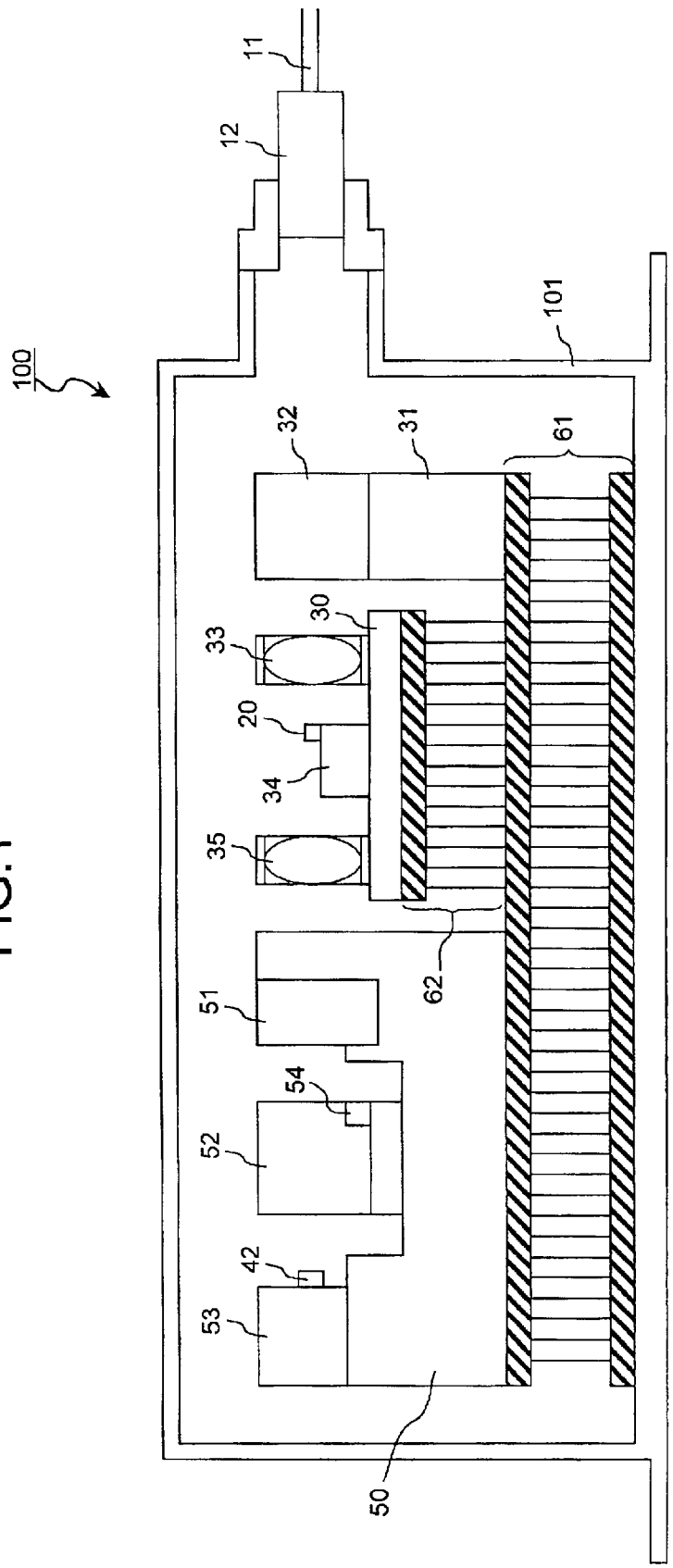
FIG. 1 is a sectional side view of a laser module according to a first embodiment in a laser outgoing direction.

Embodiments of the laser module according to the present invention will be explained in detail below, with reference to the drawings. However, the scope of the present invention is not limited by these embodiments.
(First Embodiment)
A laser module according to a first embodiment will be explained below. FIG. 1 is a sectional side view of the laser module according to the first embodiment in a laser outgoing direction. In FIG. 1, the same reference numerals are assigned to portions common to those in FIG. 28, and the explanation thereof is omitted.

Figure 28:
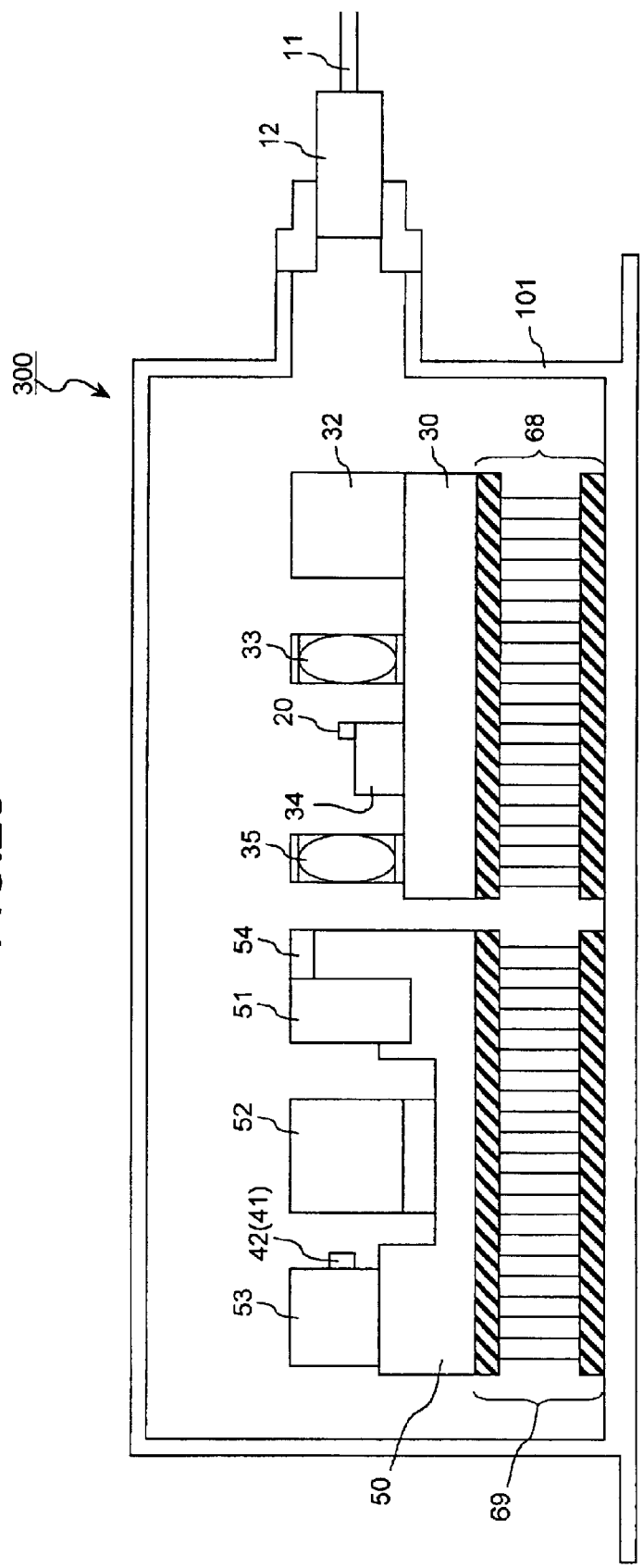
FIG. 28 is a sectional side view of a conventional laser module in a laser outgoing direction.

A laser module 100 shown in FIG. 1 is different from the laser module 300 shown in FIG. 28 in that only a first thermo-module 61 is arranged on the bottom face of the package 101, that a base 31 on which the optical isolator 32 is installed, a second thermo-module 62, and the base 50 constituting the wavelength monitoring section are provided on the first thermo-module 61, and that the laser section is arranged on the second thermo-module 62. However, the thermistor 54 is provided near the optical filter 52.

Figure 2:
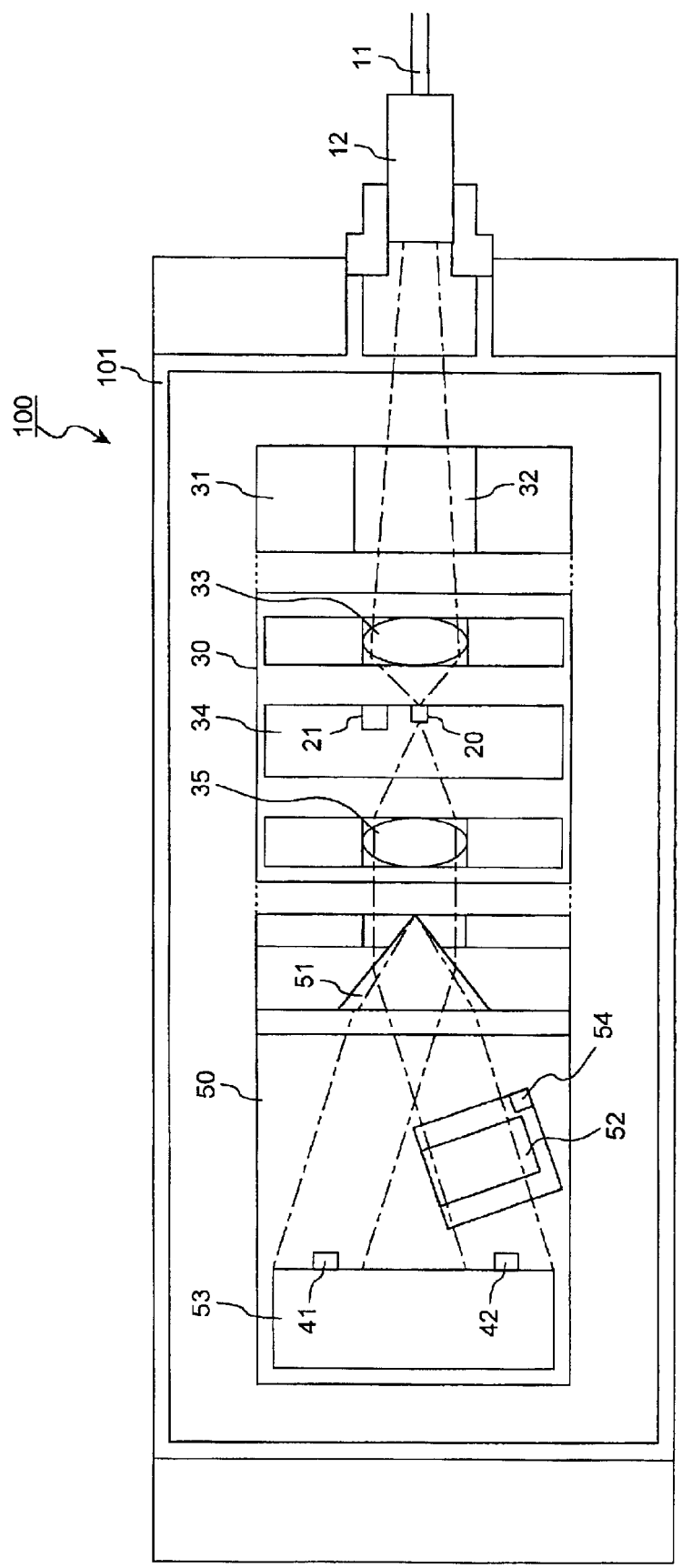
FIG. 2 is a sectional top view of the laser module according to the first embodiment in the laser outgoing direction.

FIG. 2 is a sectional top view of the laser module according to the first embodiment in the laser outgoing direction. As shown in FIG. 2, a thermistor 21 that measures the temperature of the semiconductor laser device, is provided on the submount 34 located in the laser section, in addition to the semiconductor laser device 20. On the front face (a face in a laser outgoing direction) of the submount 53 located in the wavelength monitoring section, the first optical detector 41 that receives one of the beams split by the prism 51 and the second optical detector 42 that receives the beam passing through the optical filter 52, are provided on the same plane of the submount. This optical filter 52 is formed of etalon.

Figure 3:
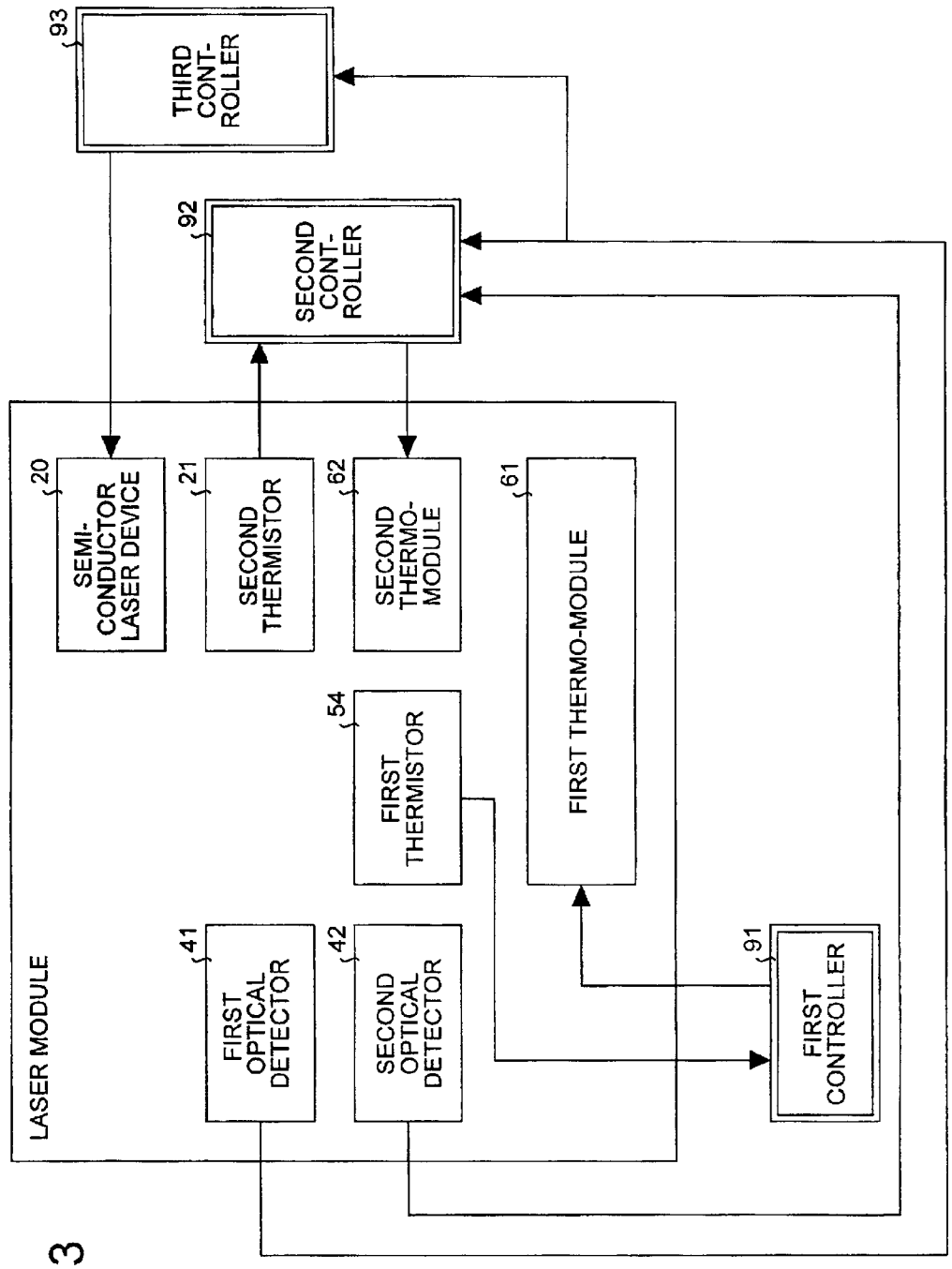
FIG. 3 is an explanatory diagram for explaining the operation of the laser module according to the first embodiment.

Temperature control in this laser module 100 will now be explained. FIG. 3 is an explanatory diagram for explaining the operation of the laser module according to the first embodiment. The thermistor 54 for measuring the temperature of the optical filter 52 is referred to as a first thermistor 54, and the thermistor 21 for measuring the temperature of the semiconductor laser device 20 is referred to as a second thermistor 21, herein.

A signal output from the first thermistor 54 is input to a first controller 91 shown in FIG. 3, thereby the first controller 91 detects the temperature of the optical filter 52. The first controller 91 calculates a difference between a desired temperature and the temperature detected by the first thermistor 54, and controls the temperature of the first thermo-module 61 so as to be constant, by designating the voltage corresponding to the difference as a control voltage. As a result, the optical filter 52 is heated or cooled via the first thermo-module 61 and the base 50, to be stabilized at the desired temperature. That is to say, the wavelength discrimination characteristic of the optical filter 52 can be stabilized.

A second controller 92 shown in FIG. 3 receives a signal output from the second thermistor 21 to thereby detect the temperature of the semiconductor laser device 20. The relationship between the temperature of the semiconductor laser device 20 and the emission wavelength is stored in the second controller, and a target temperature is set beforehand based on the relationship so that a desired wavelength is selected. Thereby, the second controller 92 controls the second thermo-module 62 so as to obtain the target temperature.

On the other hand, the monitoring laser beam output from the rear end face of the semiconductor laser device 20 passes through the collimator lens 35, and is entered into two inclined faces formed on the prism 51 at a different angle of inclination, to be split into two directions towards the first optical detector 41 and the second optical detector 42. One of the beams split by the prism 51 is converted into electric current by the first optical detector 41, and then input to the second controller 92 shown in FIG. 3. The other of the beams split by the prism 51 passes through the optical filter 52 and is converted into electric current by the second optical detector 42, and then input to the second controller 92 shown in FIG. 3.

The second controller 92 converts the electric current input from the first optical detector 41 into a voltage and uses the voltage as a reference voltage, and converts the electric current input from the second optical detector 42 into a voltage and uses the voltage as a signal voltage. As described above, the second controller 92 stores, as a standard voltage difference, a difference between the signal voltage originally obtained by allowing the beam having a desired wavelength selected in the manner to pass through the optical filter 52 and the reference voltage used when the beam of the wavelength is emitted. Hence, the second controller 92 can detect a wavelength deviation, by comparing the voltage difference between an actual reference voltage and the signal voltage, with the standard voltage difference.

The second controller 92 controls the temperature of the second thermo-module 62 based on the voltage indicating the wavelength deviation. As a result, the semiconductor laser device 20 is cooled or heated, via the first thermo-module 63, the base 30, and the submount 34. That is to say, the wavelength locking is carried out with respect to the desired wavelength selected in this manner.

The third controller 93 shown in FIG. 3 controls a current to be injected to the semiconductor laser device 20 so that the laser output becomes constant, based on the signal output from the first detector 41.

The temperature variable performance of the laser module according to the first embodiment will now be explained. Here, as one example, it is assumed that the temperature range that can be controlled in the first thermo-module 61 and the second thermo-module 62 is 60° C., and that temperature of from −5° C. to 70° C. is required as the temperature specification of the laser module package. In this case, the temperature variable range by the first thermo-module 61 becomes from 10° C. to 55° C., and therefore, it is sufficiently possible to maintain the temperature of the optical filter 52, that is, the temperature of the first thermo-module 61, constant, for example at 20° C. by the first controller 91.

In this state, the second thermo-module 62 can greatly increase the temperature variable range as compared with a conventional thermo-module because the temperature of the first thermo-module 61 on the lower stage is controlled to be constant as described above. For example, when the temperature of the first thermo-module 61 is 20° C. as in the example, the temperature variable range of the second thermo-module 62 becomes from −40° C. to 80° C., and the range width is expanded up to 120° C. This means that the temperature of the semiconductor laser device 20 can be controlled over the range of 120° C., via the submount 34 provided on the second thermo-module 62.

In the end, since the temperature dependency of the emission wavelength of the semiconductor laser device 20 is about 0.1 nm/° C., the wavelength variable range of the semiconductor laser device 20 becomes 0.1 nm×120/° C.=12 nm, and hence it becomes possible to expand the range of application to which this laser module is applied.

Figure 5:
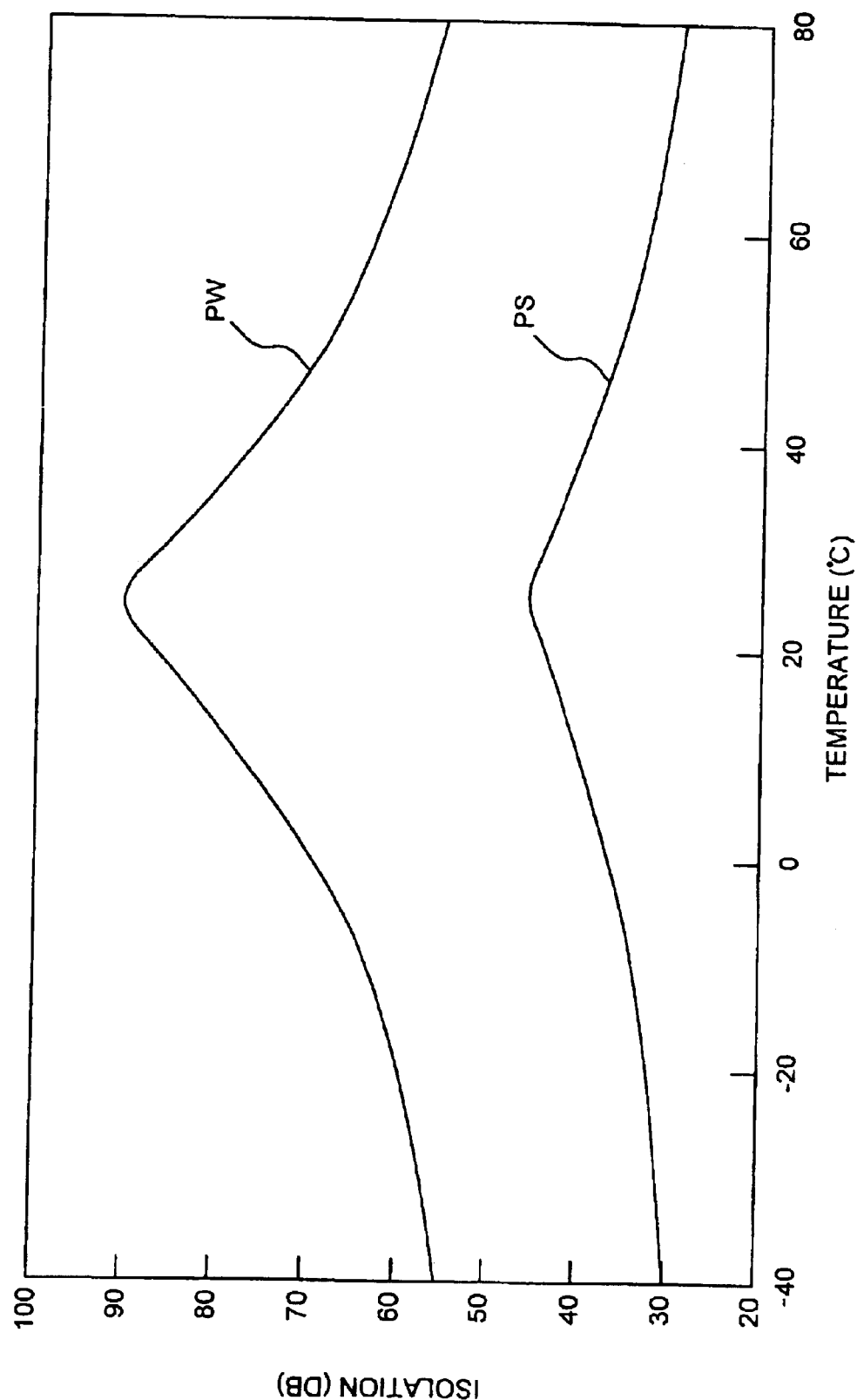
FIG. 5 is a diagram showing an example of temperature characteristic of an optical isolator.

As described above, since the temperature of the second thermo-module 62 changes according to a wavelength desired by a user, it is not desirable to provide the optical isolator 32 having a temperature characteristic on the second thermo-module 62. FIG. 5 is a diagram showing an example of temperature characteristic of the optical isolator. In FIG. 5, the graph PW shows temperature characteristic for a configuration in which two optical isolators are serially connected, and the graph PS shows temperature characteristic for one optical isolator. In either graph, it is seen that the isolation becomes largest at around 25° C.

Therefore, according to these graphs, it is preferable to keep the optical isolator 32 at 25° C. Hence, it is convenient to provide the optical isolator 32 on the first thermo-module 61, paying attention to the fact that the first thermo-module 61 is controlled at a constant temperature. According to the graphs shown in FIG. 5, the first thermo-module 61 is controlled at a constant temperature of 25° C. In this case, however, since the temperature of the optical filter 52 also becomes 25° C., the second controller 92 needs to use a value, as the standard voltage, corresponding to the characteristic of the optical filter 52 at a temperature of 25° C. In FIG. 1, the optical isolator 32 is arranged on the first thermo-module 61 via the base 31.

As explained above, according to the laser module in the first embodiment, since the optical filter 52 is provided on the first thermo-module 61 whose temperature is controlled to be constant via the base 50, the wavelength discrimination characteristic of the optical filter 52 and the optical isolator 32 can be stabilized, thereby enabling realization of more accurate wavelength locking. Further, since the second thermo-module 62 is provided on the first thermo-module 61 whose temperature is controlled to be constant, the temperature control range of the second thermo-module 62 can be expanded, which makes it possible to expand the wavelength variable range of the semiconductor laser device 20 provided on such a second thermo-module 62 via the base 30 and the submount 34.

Since the optical isolator 32 is provided on the first thermo-module 61 whose temperature is controlled to be constant via the base 31, the characteristic of the optical isolator 32 can be prevented from varying depending on the temperature, thereby enabling realization of more reliable isolation. This means that the optical isolator 32 is not provided on the second thermo-module 62. Therefore, the parts provided on the second thermo-module 62 are only the focusing lens 33, the submount 34, and the collimator lens 35, that is to say, the efficiency of heat transfer from the second thermo-module 62 to these parts can be improved, and the power consumption in the second thermo-module 62 can be reduced.

In the laser module shown in FIG. 1 and FIG. 2, the wavelength monitoring section has a configuration including the prism 51, being a kind of a beam splitter, and the first optical detector 41 and the second optical detector 42 arranged on the same plane of the submount 53. The prism has a simple configuration in which one laser beam is bifurcated by two inclined faces, and the bifurcated angle of the laser beam can be optionally set by setting the angles of the inclined faces. Hence, it is easy to minimize the wavelength monitoring section as compared with other beam splitters. However, another beam splitter, for example, a half mirror may be arranged instead of the prism 51 so that the transmitted light and the reflected light at the half mirror are received respectively by the first optical detector 41 and the second optical detector 42 provided respectively on separate submounts.

Figure 4:
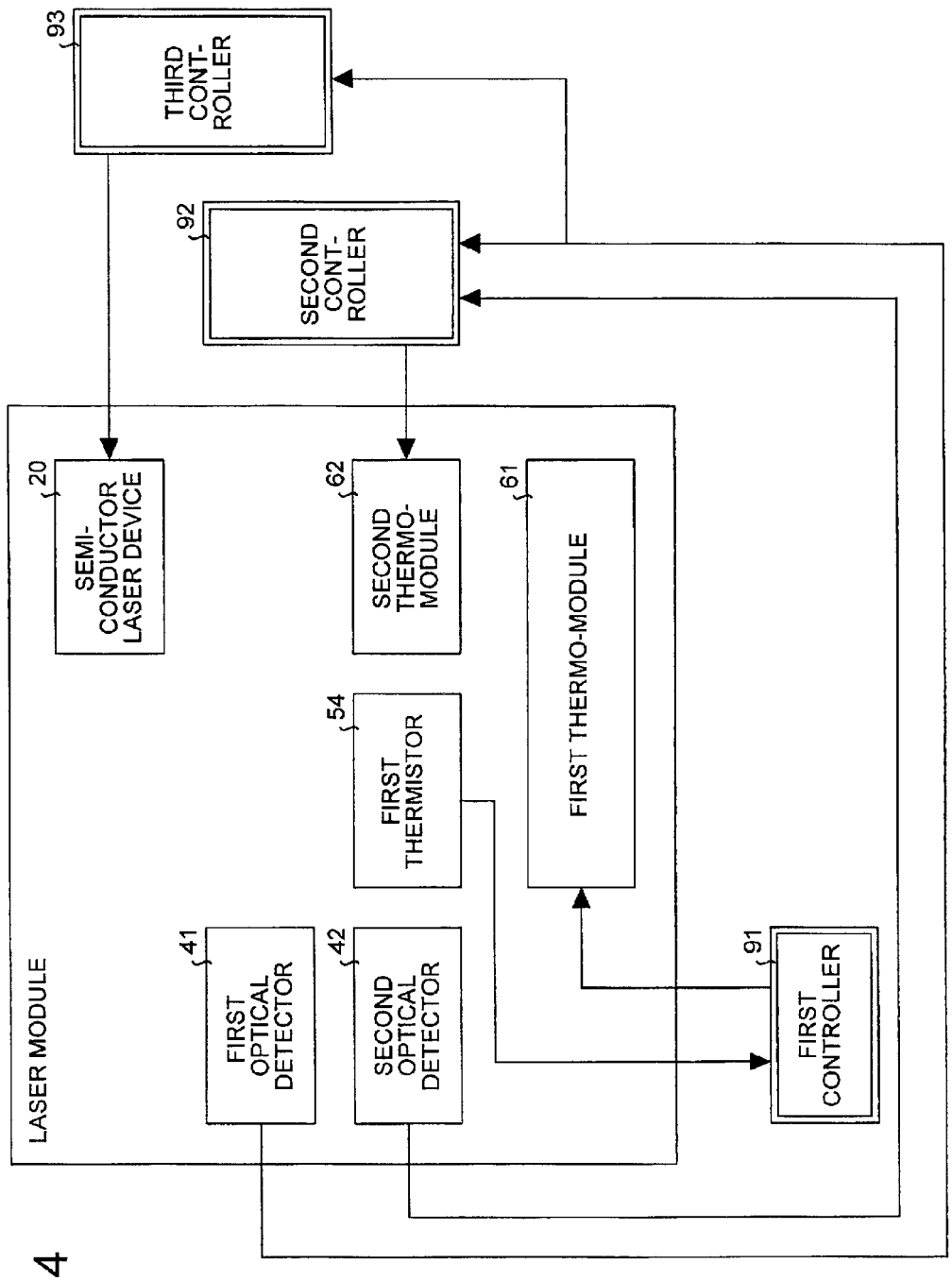
FIG. 4 is an explanatory diagram for explaining another operation example of the laser module according to the first embodiment.

In the first embodiment, as shown in FIG. 3, the temperature control of the second thermo-module 62 is performed by the second controller 92, based on both results of detecting the temperature of the semiconductor laser device 20 by the second thermistor 21 and detecting the wavelength deviation by the first optical detector 41 and the second optical detector 42. However, the second thermistor 21 may be excluded, and the temperature control of the second thermo-module 62 may be carried out only by the detection of wavelength deviation by the first optical detector 41 and the second optical detector 42. FIG. 4 is an explanatory diagram for explaining the operation of the laser module according to the first embodiment when the second thermistor 21 is excluded.

In this case, as shown in FIG. 4, the second controller 92 controls the temperature of the second thermo-module 62 based on only a voltage indicating the wavelength deviation. According, the second thermistor 21, which needs to be arranged near the semiconductor laser device 20, can be excluded. As a result, it is not necessary to secure the area for arranging the second thermistor 21, and the size of the submount 34 can be reduced.

(Second Embodiment)

A laser module according to a second embodiment will now be explained. The laser module according to the second embodiment is such that the second thermo-module is arranged near the center of the first thermo-module based on the laser module explained in the first embodiment.

Figure 6:
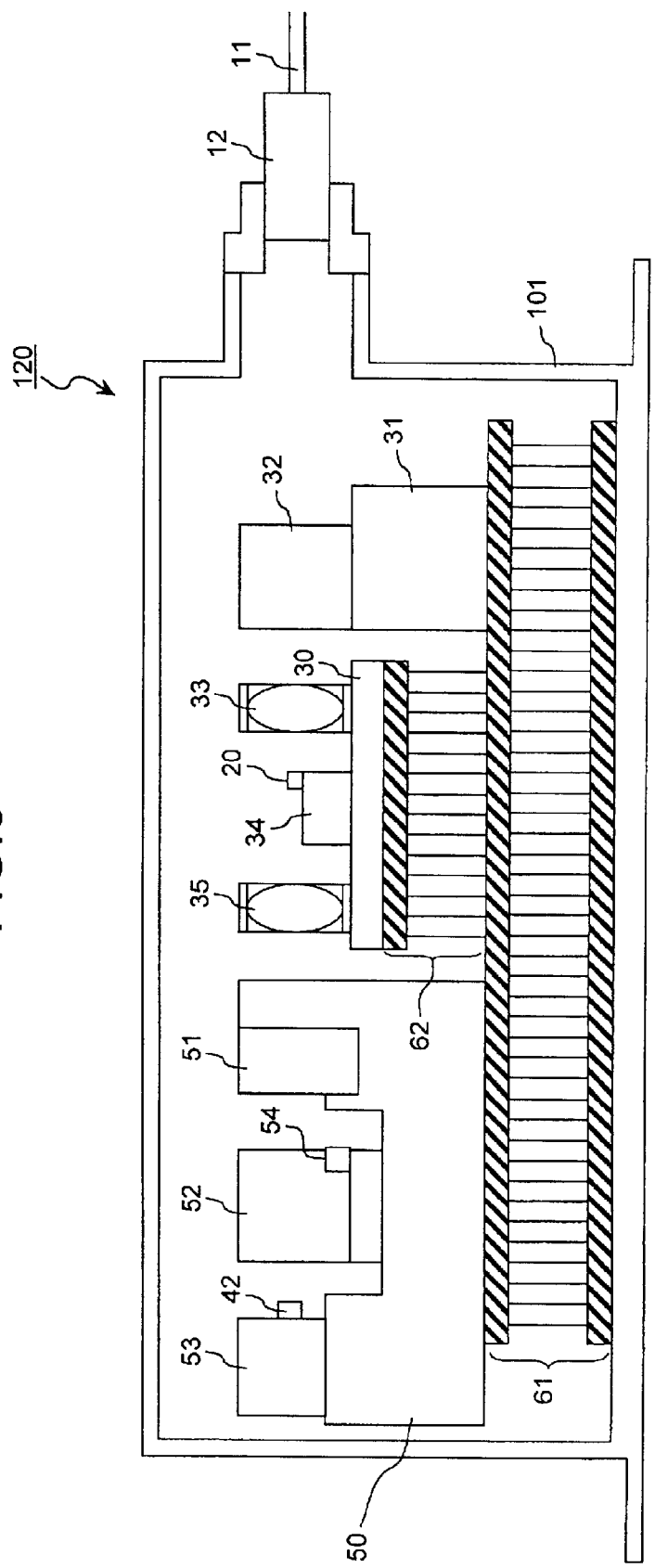
FIG. 6 is a sectional side view of a laser module according to a second embodiment in a laser outgoing direction.

FIG. 6 is a sectional side view of the laser module according to the second embodiment in a laser outgoing direction. In FIG. 6, the same reference numerals are assigned to portions common to those in FIG. 1, and the explanation thereof is omitted.

In a laser module 120 shown in FIG. 6, the second thermo-module 62 and the laser section provided on the second thermo-module 62 are arranged near the center of the first thermo-module 61. Accordingly, heat generated by the second thermo-module 62 can be uniformly absorbed by the first thermo-module 61 on the lower stage, and hence the performance of these thermo-modules can be effectively used.

Figure 7:
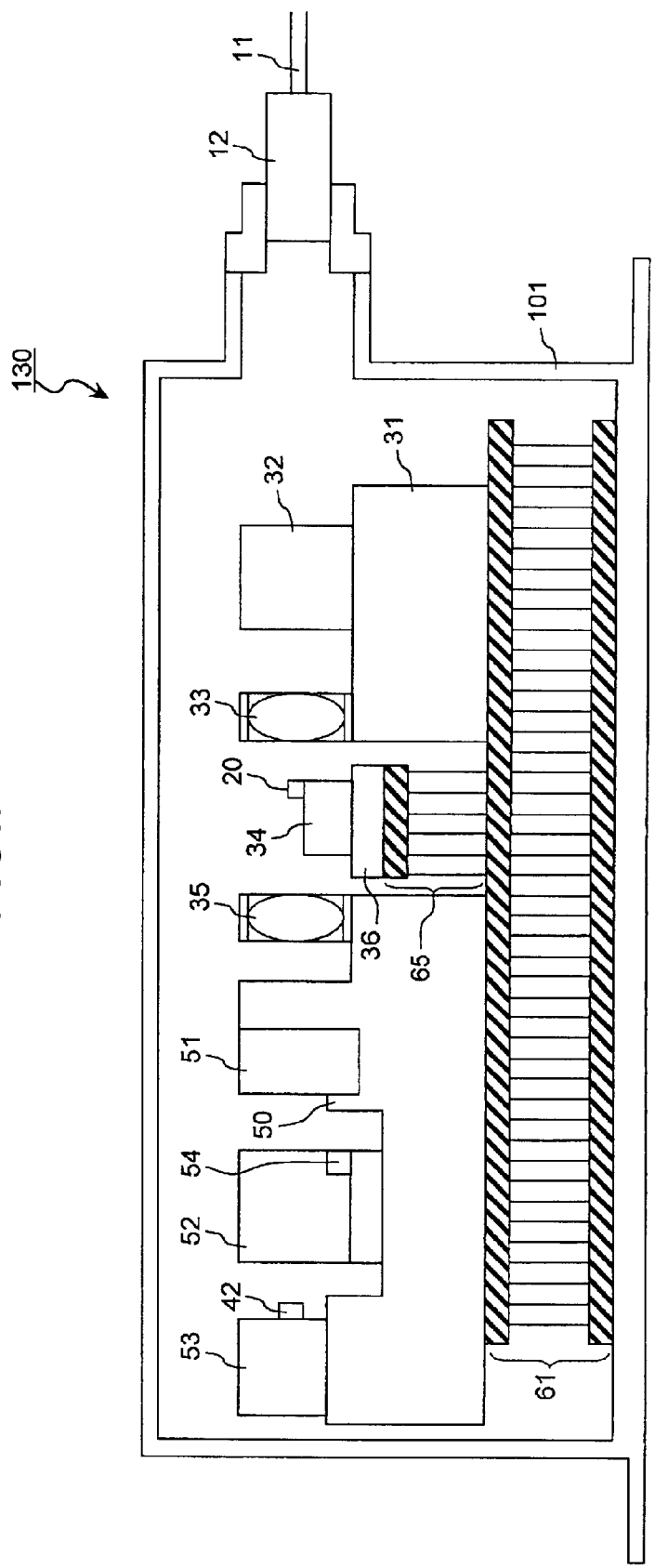
FIG. 7 is a sectional side view of another laser module according to the second embodiment in the laser outgoing direction.

FIG. 7 is a sectional side view of another laser module according to the second embodiment in the laser outgoing direction. In FIG. 7, the same reference numerals are assigned to portions common to those in FIG. 1, and the explanation thereof is omitted. In a laser module 130 shown in FIG. 7, the focusing lens 33 is provided on the base 31, the collimator lens 35 is provided on the base 50, and only the submount 34 on which the semiconductor laser device 20 is provided, is disposed on a second thermo-module 65 via a base 36. This second thermo-module 65 is also arranged near the center of the first thermo-module 61. Accordingly, the heat transfer efficiency of the second thermo-module 65 to the submount 34 is improved, and as a result, the power consumption in the second thermo-module 65 can be further reduced.

As explained above, according to the laser module according to the second embodiment, since the second thermo-module 62 (65) to be provided on the first thermo-module 61 is arranged near the center of the first thermo-module 61, the first thermo-module 61 can uniformly absorb the heat generated by the second thermo-module 62, and hence the heating and cooling ability of the first thermo-module 61 can be effectively used. In other words, the power consumption in the first thermo-module 61 can be reduced, which brings about such an effect that the temperature variable range is expanded with the same power consumption, that is, the variable range of the emission wavelength by the semiconductor laser device 20 can be expanded.

By disposing only the submount 34 on which the semiconductor laser device 20 is provided, on the second thermo-module 65, the power consumption in the second thermo-module 65 can be also reduced.

(Third Embodiment)

A laser module according to a third embodiment will now be explained. In the laser module according to the first embodiment, the wavelength monitoring section is formed so as to use the laser beam output from the rear end face of the semiconductor laser device 20. However, in the laser module according to the third embodiment, the wavelength monitoring section is formed so as to use the laser beam output from the front end face of the semiconductor laser device 20.

Figure 8:
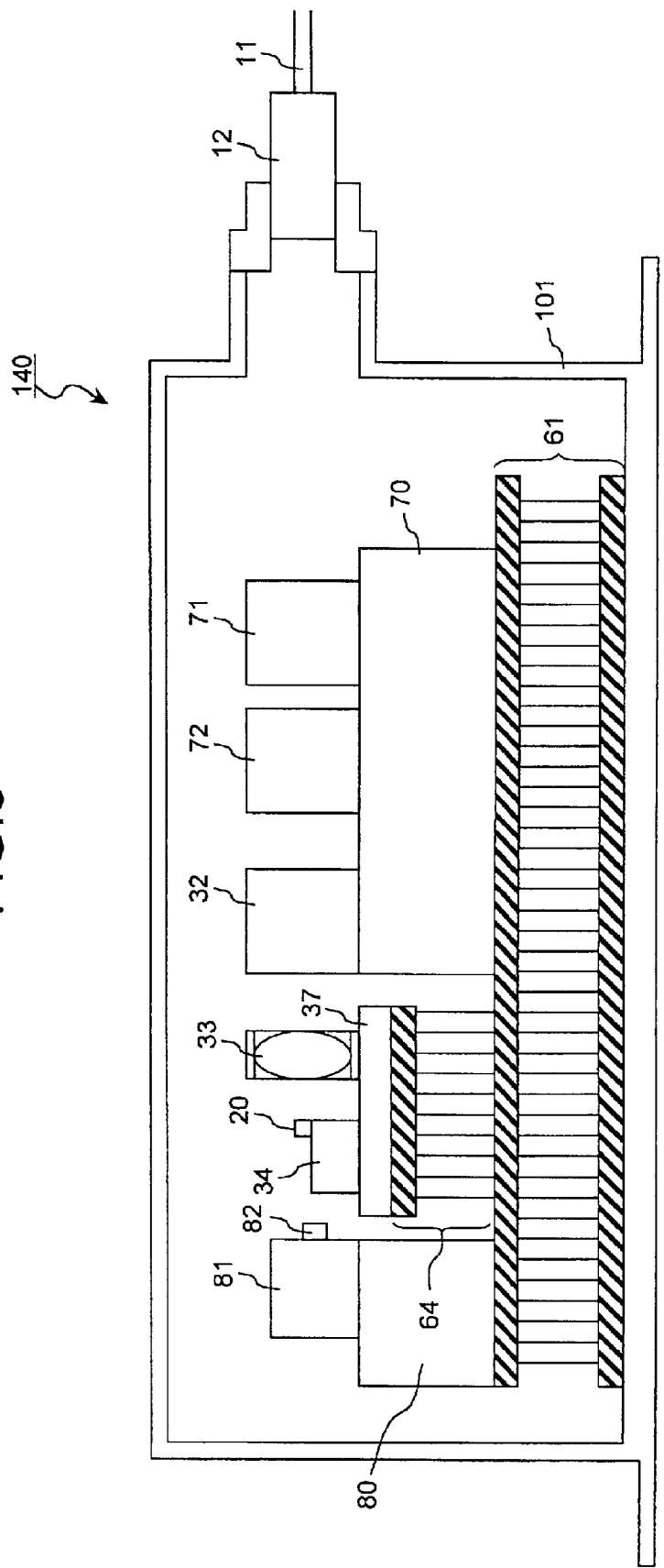
FIG. 8 is a sectional side view of a laser module according to a third embodiment in a laser outgoing direction.

FIG. 8 is a sectional side view of the laser module according to the third embodiment in a laser outgoing direction. In FIG. 8, the same reference numerals are assigned to portions common to those in FIG. 1, and the explanation thereof is omitted. In a laser module 140 shown in FIG. 8, a base 80, a second thermo-module 64, and a base 70 are provided on the first thermo-module 61. A submount 81 is provided on the base 80, and the front face of the submount 81 (a face in the laser outgoing direction) has an optical detector 82, provided thereon, that receives laser beams output from the rear end face of the semiconductor laser device 20.

A base 37 is arranged on the second thermo-module 64, and on the base 37, there are provided the submount 34 provided with the semiconductor laser device 20 thereon, and a focusing lens 33 which focuses laser beams output from the front end face of the semiconductor laser device 20 onto the optical fiber 11. On the base 70, the optical isolator 32 for interrupting reflected return light from the optical fiber 11 side, a submount 71, and a submount 72 are provided.

Figure 9:
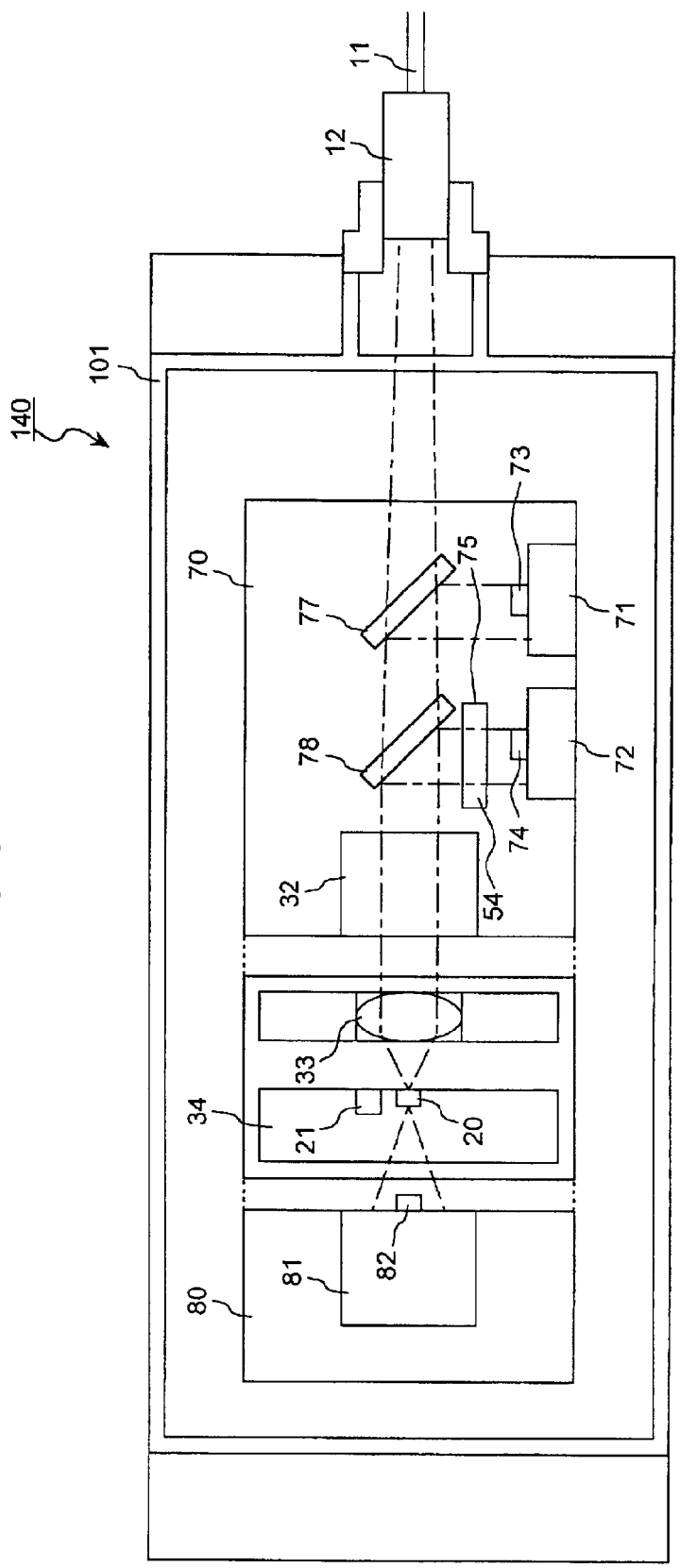
FIG. 9 is a sectional top view of the laser module according to the third embodiment in the laser outgoing direction.

FIG. 9 is a sectional top view of the laser module according to the third embodiment in the laser outgoing direction. As shown in FIG. 9, the thermistor 21 which measures the temperature of the semiconductor laser device 20, is provided in addition to the semiconductor laser device 20, on the submount 34 located in the laser section. A half mirror 78 which transmits the light having passed through the optical isolator 32 and reflects the light substantially at 90 degrees with respect to the incident direction so as to direct the light towards the submount 72, a half mirror 77 which transmits the light having passed through the half mirror 78 and reflects the light substantially at 90 degrees with respect to the incident direction so as to direct the light towards the submount 71, and an optical filter 75 which allows the light reflected by the half mirror 78 to enter therein, are provided on the base 70 constituting the wavelength monitoring section.

A first optical detector 73 which receives light reflected by the half mirror 77, is provided on the front face of the submount 71, and a second optical detector 74 which receives light having passed through the optical filter 75, is provided on the front face of the submount 72. The optical filter 75 is formed of etalon, and a photo diode is used for the first optical detector 73 and the second optical detector 74.

Temperature control in this laser module 140 is carried out in the same manner as that explained in the first embodiment, and hence the explanation thereof is omitted. The first optical detector 73 and the second optical detector 74 correspond to the first optical detector 41 and the second optical detector 42, respectively shown in FIG. 3. Though not shown in FIG. 9, a thermistor corresponding to the first thermistor 54 shown in FIG. 3 is arranged near the optical filter 75.

In FIG. 8 and FIG. 9, the optical detector 82 monitors the output power of the semiconductor laser device 20, and the detected current is input to the third controller 93 shown in FIG. 3.

As explained above, according to the laser module in the third embodiment, even when the wavelength monitoring section is arranged on the front face (on the optical fiber 11 side) of the semiconductor laser device 20 from which the laser is emitted, the effect due to the first embodiment can be obtained.

In FIG. 8, the effect due to the second embodiment can be also obtained by arranging the second thermo-module 64 near the center of the first thermo-module 61. In this case, the focusing lens 33 may further be provided on the base 70.

(Fourth Embodiment)

A laser module according to a fourth embodiment will be explained below. In the laser modules according to the first to third embodiments, both of the second thermo-module on which the semiconductor laser device 20 is mounted and the wavelength monitoring section are arranged on the first thermo-module 61. However, in the laser module according to the fourth embodiment, the second thermo-module and the wavelength monitoring section are arranged on different thermo-modules, respectively.

Figure 10:
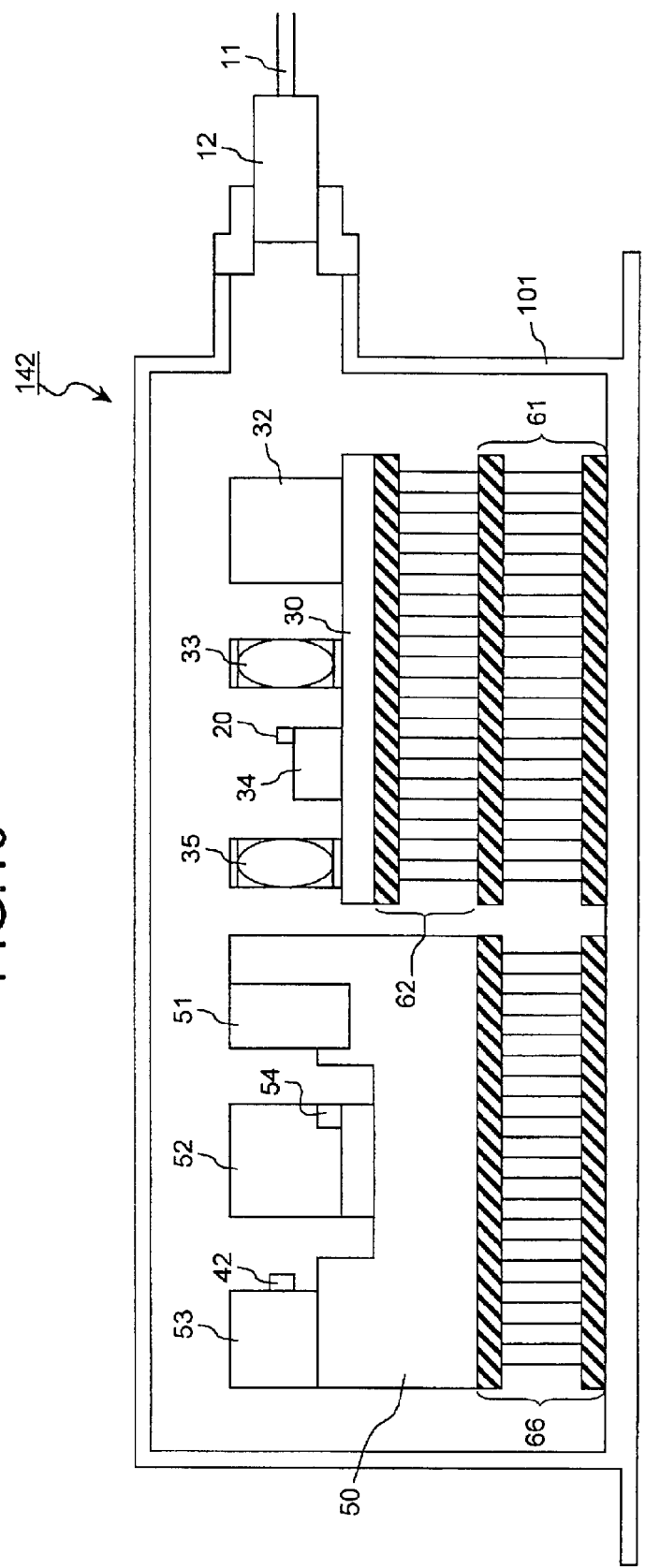
FIG. 10 is a sectional side view of a laser module according to a fourth embodiment in a laser outgoing direction.

FIG. 10 is a sectional side view of the laser module according to the fourth embodiment in a laser outgoing direction. In FIG. 10, the same reference numerals are assigned to portions common to those in FIG. 1, and the explanation thereof is omitted. In a laser module 142 shown in FIG. 10, the second thermo-module 62 is provided on the first thermo-module 61, and the base 50 constituting the wavelength monitoring section is provided on a third thermo-module 66 arranged side by side in isolation from the first thermo-module 61. In FIG. 10, the base 31 shown in FIG. 1 is excluded, and the optical isolator 32 is provided on the base 30.

Figure 11:
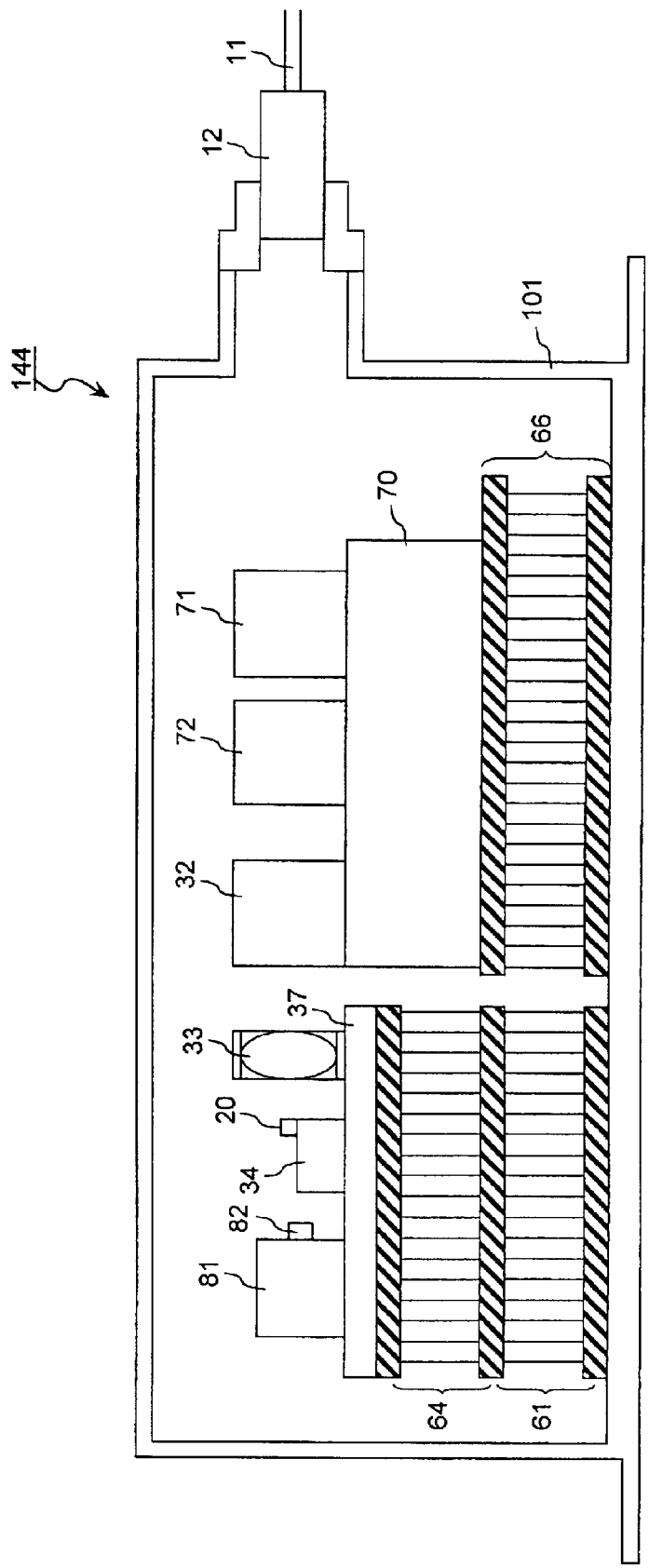
FIG. 11 is a sectional side view of another laser module according to the fourth embodiment in the laser outgoing direction.

FIG. 11 is a sectional side view of another laser module according to the fourth embodiment in a laser outgoing direction. In FIG. 11, the same reference numerals are assigned to portions common to those in FIG. 8, and the explanation thereof is omitted. In a laser module 144 shown in FIG. 11, the second thermo-module 64 is provided on the first thermo-module 61, and the base 70 constituting the wavelength monitoring section is provided on the third thermo-module 66 arranged side by side in isolation from the first thermo-module 61. In FIG. 11, the base 80 shown in FIG. 8 is excluded, and the submount 81 is provided on the base 37.

In this manner, by providing the second thermo-module 62 (or 64) on which the laser section is mounted and the wavelength monitoring section on different thermo-modules, the influence of the temperature change of the second thermo-module 62 (or 64) on the wavelength monitoring section via the first thermo-module can be reduced. Since the optical isolator 32 and the wavelength monitoring section are temperature-controlled by different thermo-modules, optimum temperature can be maintained respectively. That is to say, with the maintenance, the wavelength discrimination characteristic of the optical filters 52 and 75 can be stabilized in an optimum state, and the isolation characteristic of the optical isolator 32 can be fixed to an optimum value.

The temperature control in this embodiment is made possible by connecting the third thermo-module 66 to the first controller 91, for example, in FIG. 3. In this case, the first controller 91 controls the temperature of the third thermo-module 66 constantly at a desired temperature based on a signal output from the first thermistor 54, and also controls the temperature of the first thermo-module 61 constantly at a preset temperature.

As another temperature control method in this embodiment, in FIG. 10, the first thermo-module 61 and the second thermo-module 62 may be serially connected to form an integral thermo-module, or in FIG. 11, the first thermo-module 61 and the second thermo-module 64 may be connected serially or parallel with each other to form an apparently integral thermo-module, so that the temperature control can be performed by the second controller based on values detected by the second thermistor 21, respectively. Particularly, when these modules are serially connected, the current flowing through each thermo-element pair constituting the thermo-module can be stably controlled, and a heat transport capacity ratio of the first thermo-module 61 and the second thermo-module 62 (or 64) can be constantly maintained, and temperature control can be performed efficiently. By this configuration, the input-output terminals of the thermo-module laminated in two stages can be shared, and hence the number of terminals to be used can be reduced, thereby enabling easy control.

As explained above, according to the laser module in the fourth embodiment, in the configuration of the laser modules shown in the first to third embodiments, the second thermo-module 62 (or 64) and the wavelength monitoring section are arranged respectively on different thermo-modules. Therefore, the temperature of the optical isolator 32 on the second thermo-module 62 (or 64) and the optical filter 52 (or 75) constituting the wavelength monitoring section can be set to a separate temperature, thereby enabling realization of the wavelength monitoring section and the optical isolation in the optimum condition.

It is noted that, as shown in FIG. 1, the optical isolator 32 may be provided on the first thermo-module 61 via the base 31, or as shown in FIG. 8, the submount 81 may be provided on the third thermo-module 66 via the base 80. After all, the thermo-module (corresponding to the first thermo-module) on which the thermo-module (corresponding to the second thermo-module) for controlling the temperature of the semiconductor laser device is provided, needs only to be different from the thermo-module (corresponding to the third thermo-module) on which the wavelength monitoring section is mounted. From this point of view, this embodiment can be applied, in the same manner, to the configuration explained in the second embodiment.

(Fifth Embodiment)

A laser module according to a fifth embodiment will be explained below. The laser module according to the fifth embodiment is such that in the laser modules according to the first and the third embodiments, the second thermo-module is excluded and a heater is arranged near the semiconductor laser device (on the lower layer herein).

Figure 12:
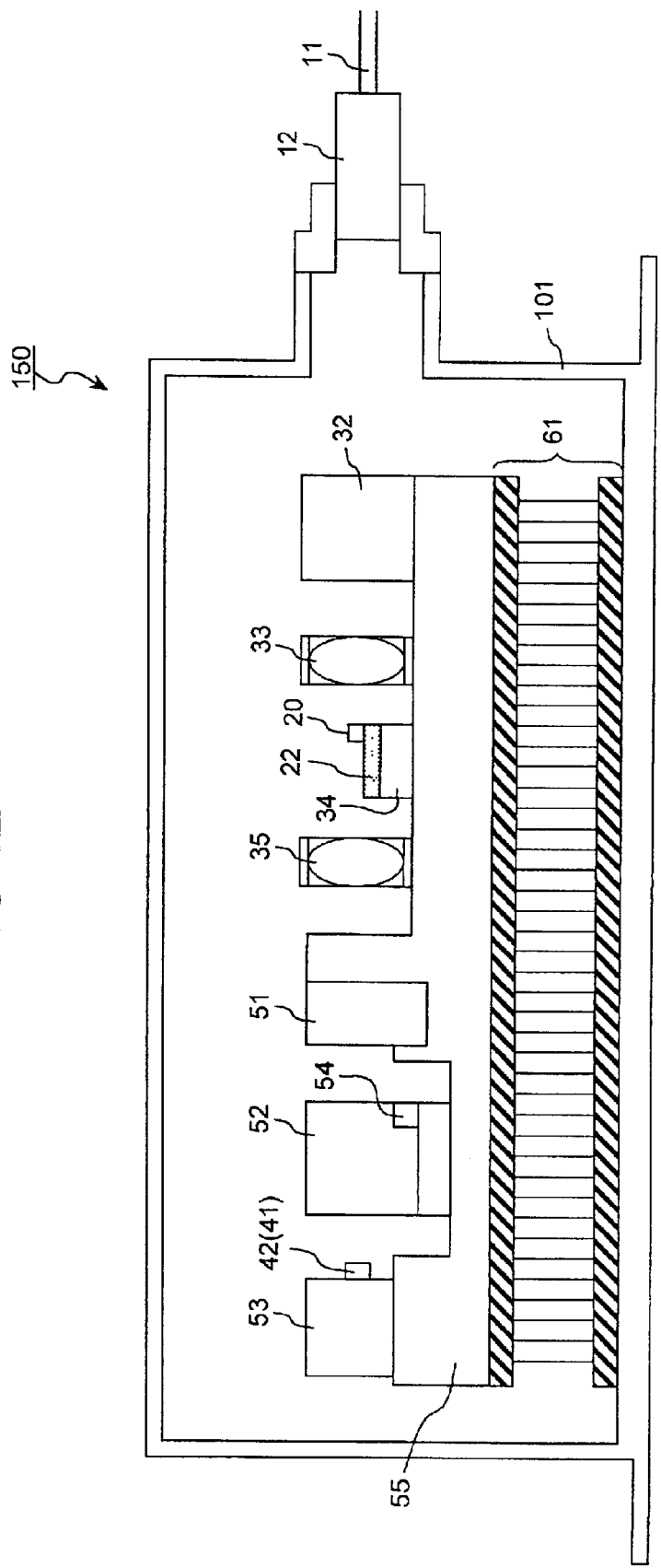
FIG. 12 is a sectional side view of a laser module according to a fifth embodiment in a laser outgoing direction.

FIG. 12 is a sectional side view of the laser module according to the fifth embodiment in a laser outgoing direction. In FIG. 12, the same reference numerals are assigned to portions common to those in FIG. 1, and the explanation thereof is omitted. In a laser module 150 shown in FIG. 12, the base 31, the base 30, and the base 50 shown in FIG. 1 are arranged as a common base 55 on the first thermo-module 61, and a heater 22 is arranged between the submount 34 and the semiconductor laser device 20.

The heater 22 functions in the same manner as the second thermo-module 62 shown in FIG. 1, so that the temperature of the semiconductor laser device 20 is changed to make the emission wavelength variable. Therefore, the heater 22 is not always arranged on the lower layer of the semiconductor laser device 20, and may be arranged at any position near the semiconductor laser device 20 if the function is satisfied. For example, when the temperature of the first thermo-module 61 is controlled at 10° C., the heater 22 can raise the heat temperature to more than 50° C. In this case, it is possible to realize a change in the emission wavelength of at least 0.1 nm/° C.×50° C.=5 nm.

Figure 13:
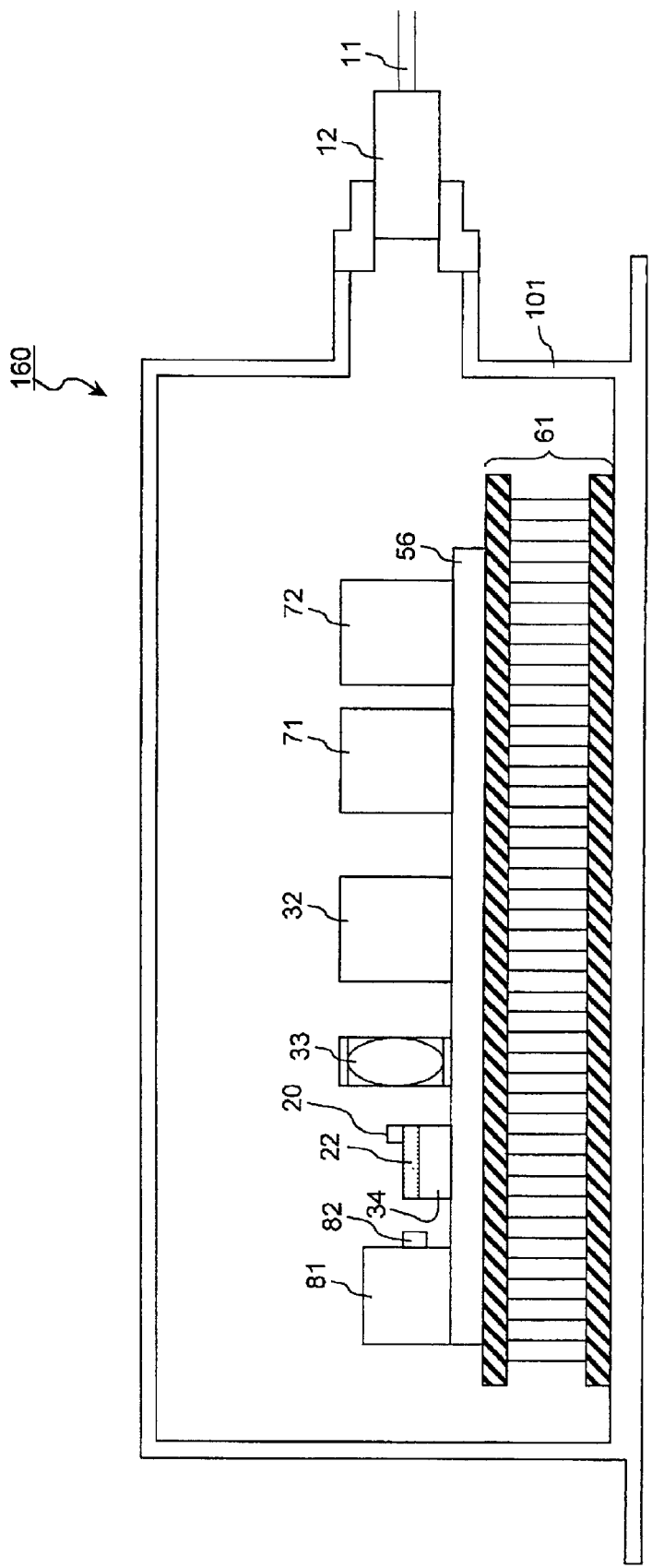
FIG. 13 is a sectional side view of another laser module according to the fifth embodiment in the laser outgoing direction.

FIG. 13 is a sectional side view of another laser module according to the fifth embodiment in the laser outgoing direction. In FIG. 13, the same reference numerals are assigned to portions common to those in FIG. 8, and the explanation thereof is omitted. In a laser module 160 shown in FIG. 13, the base 70, the base 37 and the base 80 shown in FIG. 8 are arranged as a common base 56 on the first thermo-module 61, and the heater 22 is arranged between the submount 34 and the semiconductor laser device 20. The operation of this laser module 160 is the same as that of the laser module 150 shown in FIG. 12.

As described above, according to the laser module in the fifth embodiment, in the configuration of the laser module shown in the first and the third embodiments, the second thermo-module is excluded, and the heater 22 is provided instead of the second thermo-module near the semiconductor laser device 20. Thereby, the effects obtained by the first and the third embodiments can be also obtained.

(Sixth Embodiment)

A laser module according to a sixth embodiment will be explained below. The laser module according to the sixth embodiment is such that in the laser modules according to the first to fourth embodiments, a thermal insulating or insulating member is filled between the second thermo-module and the base or the like arranged side by side in isolation from the second thermo-module.

Figure 14:
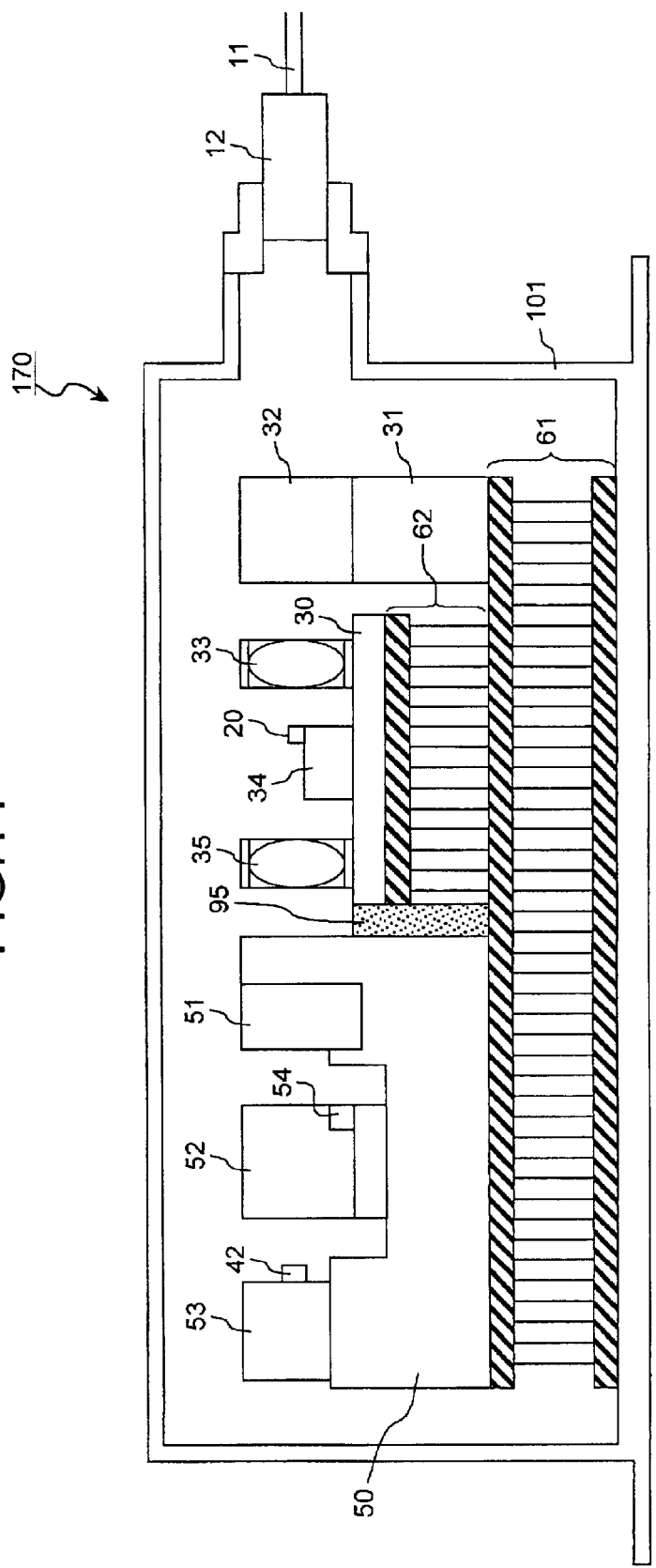
FIG. 14 is a sectional side view of a laser module according to a sixth embodiment in a laser outgoing direction.
Figure 15:
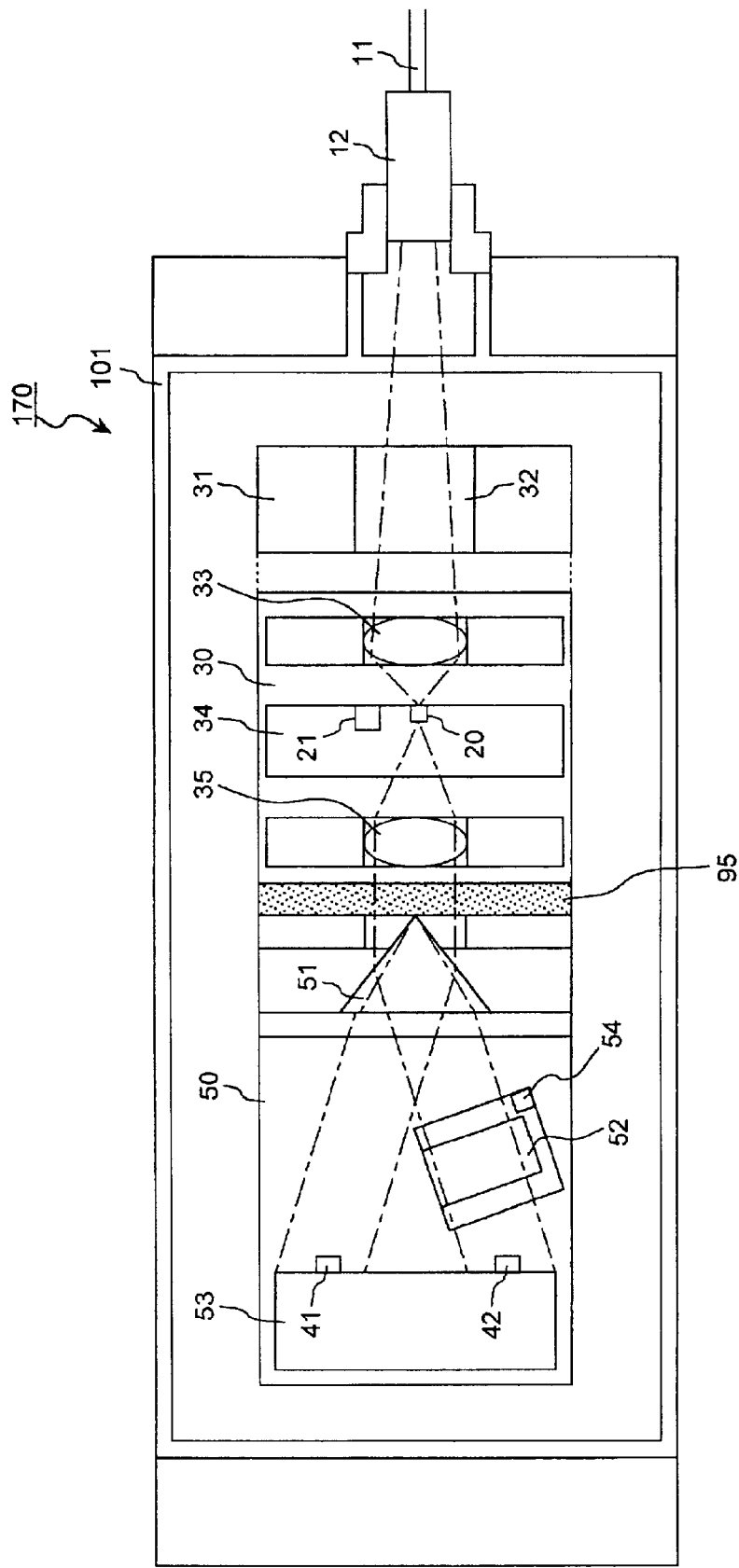
FIG. 15 is a sectional top view of the laser module according to the sixth embodiment in the laser outgoing direction.

FIG. 14 is a sectional side view of the laser module according to the sixth embodiment in a laser outgoing direction. In FIG. 14, the same reference numerals are assigned to portions common to those in FIG. 1, and the explanation thereof is omitted. FIG. 15 is a sectional top view of the laser module according to the sixth embodiment in the laser outgoing direction. In FIG. 15, the same reference numerals are assigned to portions common to those in FIG. 2, and the explanation thereof is omitted.

In FIG. 14 and FIG. 15, a point different from FIG. 1 and FIG. 2 is that a member 95 having insulation or thermal insulation is filled between the second thermo-module 62 and the base 50 which is the wavelength monitoring section.

For example, when the member 95 is formed of an insulating material, it can be prevented that the second thermo-module 62 and the base 50 are electrically brought into contact with each other and are short circuited. When the member 95 is formed of a thermal insulating material, it can be prevented that the heat generated by the second thermo-module 62 is transmitted to the base 50, being the wavelength monitoring section, and thereby the base 50 is thermally deteriorated.

As the insulating material, ceramics and resins can be used, for example, glass-epoxy (glass fiber+epoxy resin), paper phenol resin, polyimide, mica, glass, epoxy, polyethylene, and Teflon (registered trademark). As the thermal insulating material, porous materials can be used, for example, glass fiber, ceramic fiber, rock wool, gas cement, hollow glass beads, urethane foam, and polystyrene foam. As the member 95, a material having both insulation and thermal insulation is preferable, but almost all of the materials have both properties.

Figure 16:
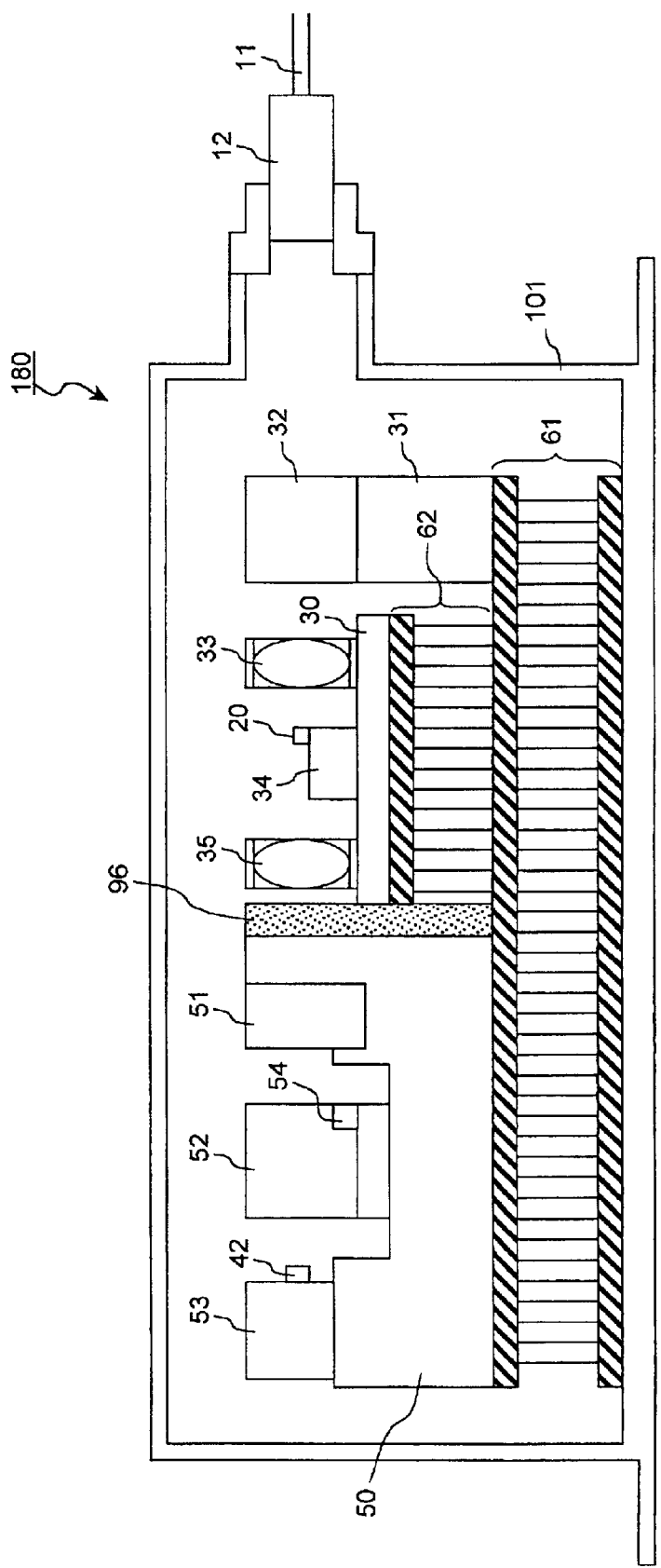
FIG. 16 is a sectional side view of another laser module according to the sixth embodiment in the laser outgoing direction.
Figure 17A:
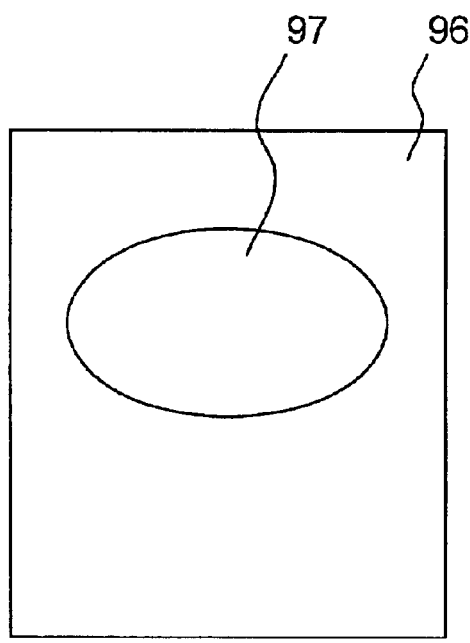
FIG. 17A and FIG. 17B are diagrams showing examples of a window formed in a member.
Figure 17B:
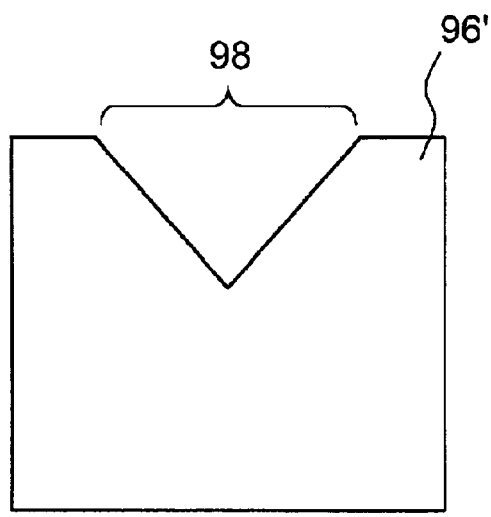

FIG. 16 is a sectional side view of another laser module according to the sixth embodiment in the laser outgoing direction. The member 95 having a height up to the upper surface of the base 30 is filled in the laser module 170 shown in FIG. 14. In the laser module 180 shown in FIG. 16, however, a member 96 having a height up to the upper surface of the base 50, which is the wavelength monitoring section, is filled. In this case, it is necessary to form an optical window in the member 96, in order to ensure an optical path from the collimator lens 35 to the wavelength monitoring section. FIG. 17A and FIG. 17B are diagrams showing examples of a window formed in the member 96. As shown in FIG. 17A, the member 96 has an elliptic optical window 97 provided in the portion which becomes the optical path. This optical window can be formed of a material having optically high transparency, such as glass and sapphire, but it may be only an opening. Alternatively, as shown in a member 96' of FIG. 17B, a notch 98 may be formed to ensure the optical path.

The member 95, 96, or 96' may be filled between the base 31 provided with the optical isolator 32 thereon and the second thermo-module 62.

In the example, the member 95, 96, or 96' is filled with respect to the configuration shown in FIG. 1 which explains the first embodiment, but the member can be filled in the same manner with respect to the configuration explained in the second to fourth embodiments.

As explained above, according to the laser module in the sixth embodiment, since an insulating or thermal insulating member is filed between the second thermo-module 62 and the parts arranged parallel each other nearby, an electric short or unnecessary heat conduction between these can be prevented. As a result, operation with high reliability or reduction in power consumption by the second thermo-module can be realized.

In the first to sixth embodiments, the prism or the half mirror is shown as one example of the beam splitter, but any other beam splitters may be used.

(Seventh Embodiment)

A laser module according to a seventh embodiment will be explained below. The laser module according to the seventh embodiment is such that a first thermo-module, a thermal conductor, a second thermo-module, and a semiconductor laser device are arranged in order from the bottom face of the package.

FIG. 18 is a sectional side view of the laser module according to the seventh embodiment in a laser outgoing direction. In FIG. 18, the same reference numerals are assigned to portions common to those in FIG. 28, and the explanation thereof is omitted. A laser module 200 shown in FIG. 18 is different from the laser module 300 shown in FIG. 28 in that only a first thermo-module 261 is arranged on the bottom face of the package 101, that a thermal conductor 270 is arranged in contact with the whole surface of the first thermo-module 261, that a second thermo-module 262 replacing the submount 34 is arranged on the thermal conductor 270 in addition to the optical isolator 32, the focusing lens 33, the collimator lens 35, the prism 51, the optical filter 52, and the submount 53, and that the semiconductor laser device 20 is arranged on the second thermo-module 262.

The thermal conductor 270 has a shape similar to the conventional base on which respective parts are arranged, and is formed of a material having high thermal conductivity, such as diamond, aluminum, aluminum alloy, graphite, copper, copper alloy, copper-tungsten, aluminum nitride, aluminum silicon carbide (AlSiC), and boron nitride. Particularly, it is preferable that the thermal conductor 270 is formed of a material having a thermal conductivity of about 130 W/m·K or higher, and has a thickness of at least 100 μm. These materials are known, also in the conventional laser module, as materials used for members referred to as a base, a submount, a carrier, and a heat sink, or as materials that can be used for the members. However, in this embodiment, the purpose of the material is different from that of the conventional laser module, in association with the use of the second thermo-module described later. The purpose thereof will be explained later.

The second thermo-module 262 is used to carry out temperature adjustment of the semiconductor laser device 20 arranged on the upper surface thereof, and it is desirable that the size of the second thermo-module 262 is smaller than that of the first thermo-module 261, from a viewpoint of thermal conduction efficiency to the semiconductor laser device 20 and low power consumption. Consequently, as the second thermo-module 262, one having lower temperature adjusting ability than that of the first thermo-module 261 is used. In particular, as shown in FIG. 18, it is more preferable that the second thermo-module 262 has a shape and a size such that one side thereof is on the same plane as the front end face of the semiconductor laser device 20, and the other side is on the same plane as the rear end face of the semiconductor laser device 20. The reason thereof is because if a plane in contact with the lower face of the semiconductor laser device 20 exists immediately before of the front end face or immediately behind the rear end face of the semiconductor laser device 20, a part of the laser beam emitted from these end faces is reflected by this plane, thereby causing a drop in the optically coupling efficiency and a disturbance in the operation of the wavelength monitoring section.

As shown in FIG. 18, since it is necessary to arrange other parts such as the focusing lens 33 together with the second thermo-module 262 on the thermal conductor 270, the size of the second thermo-module 262 becomes smaller than the first thermo-module 261. For the second thermo-module 262, the Peltier element arrangement similar to the first thermo-module 68 and the second thermo-module 69 shown in FIG. 28 can be employed by simply reducing the size thereof. Alternatively, a structure can be adopted, which is formed by a method of directly forming an electrode and a thermoelectric material wafer on an insulating substrate and preparing two of these obtained by cutting the thermoelectric material and partially removing it in a comb-like shape, and bonding these two together so as to fit each other. Further, a thin structure may be adopted, which is formed by a method of growing a thermoelectric material on the substrate by sputtering or vacuum evaporation.

FIG. 19 is a sectional top view of the laser module according to the seventh embodiment in the laser outgoing direction. As shown in FIG. 19, a first optical detector 41 that receives one of the beams split by the prism 51 and a second optical detector 42 that receives the beam passing through the optical filter 52, are provided on the same plane of the front face (a face in a laser outgoing direction) of the submount 53. The optical filter 52 is formed of etalon.

Figure 20:
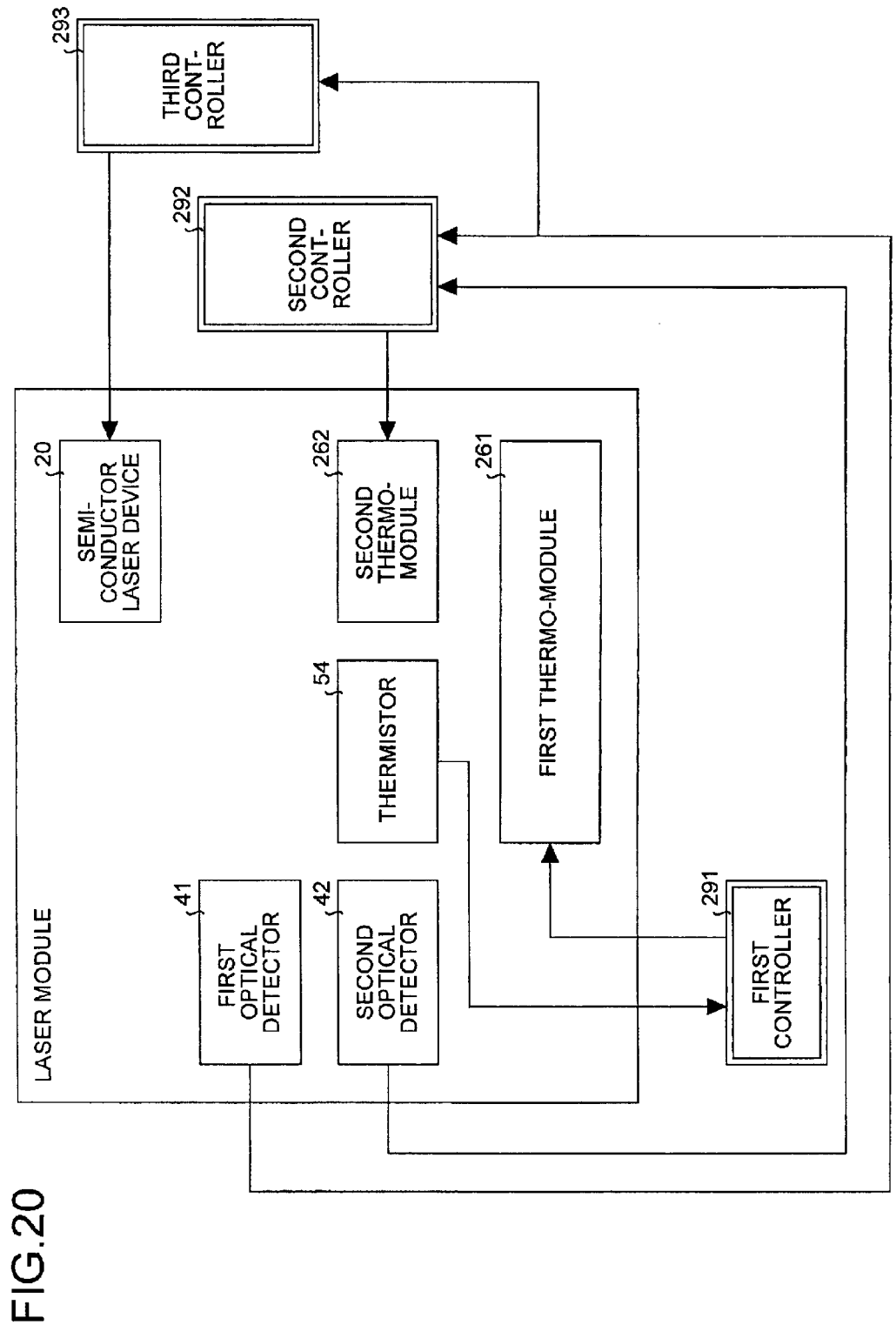
FIG. 20 is an explanatory diagram for explaining the operation of the laser module according to the seventh embodiment.

Temperature control in this laser module 200 will be explained below. FIG. 20 is an explanatory diagram for explaining the operation of the laser module according to the seventh embodiment. A first controller 291 shown in FIG. 20 receives a signal output from the thermistor 54, and detects the temperature of the optical filter 52. The first controller 291 calculates a difference between a desired temperature and the temperature detected by the thermistor 54, and controls the temperature of the first thermo-module 261 to be constant, by designating the voltage corresponding to the difference as a control voltage. As a result, the optical filter 52 is heated or cooled via the first thermo-module 261 and the thermal conductor 270, to be stabilized at the desired temperature. That is to say, the wavelength discrimination characteristic of the optical filter 52 can be stabilized.

Since the thermal conductor 270 in particular has high thermal conductivity, thermal conduction between the first thermo-module 261 and the optical filter 52 becomes quick and has a low loss, thereby the optical filter 52 can be quickly stabilized with a predetermined wavelength discrimination characteristic. Further, the temperature of the package 101 rises due to cooling operation of the first thermo-module 261, and the heat flows into the thermal conductor 270 and each component arranged on the thermal conductor 270 from the package 101, but the heat quickly expands over the whole upper surface of the first thermo-module 261, due to the high thermal conductivity of the thermal conductor 270, thereby enabling cooling at high efficiency.

In FIG. 19, the monitoring laser beam output from the rear end face of the semiconductor laser device 20 passes through the collimator lens 35, and is entered into two inclined faces formed on the prism 51 at a different angle of inclination, to be split into two directions towards the first optical detector 41 and the second optical detector 42. One of the beams split by the prism 51 is converted into electric current by the first optical detector 41, and then input to a second controller 292 shown in FIG. 20. The other of the beams split by the prism 51 passes through the optical filter 52 and is converted into electric current by the second optical detector 42, and then input to the second controller 292 shown in FIG. 20.

In the second controller 292, the electric current input from the first optical detector 41 is converted into a voltage, the voltage is used as a reference voltage, and the electric current input from the second optical detector 42 is converted into a voltage, and the voltage is used as a signal voltage. As described above, the second controller 292 stores a difference, as a standard voltage difference, between the signal voltage originally obtained by allowing beams having the desired wavelength selected in the manner to pass through the optical filter 52 and the reference voltage at the time when the beam of the wavelength is emitted. Hence, the second controller 292 can detect a deviation of the wavelength, by comparing the voltage difference between an actual reference voltage and the signal voltage, with the standard voltage difference.

The second controller 292 controls the temperature of the second thermo-module 262 based on the voltage indicating the deviation of wavelength. As a result, the semiconductor laser device 20 is cooled or heated, and the wavelength locking is carried out with respect to the desired wavelength selected in the manner. Particularly, since the temperature of the first thermo-module 261 located below via the thermal conductor 270 is controlled to be constant, the second thermo-module 262 is not affected by the environmental temperature and the temperature of the package, and hence the temperature control range can be greatly increased as compared with the conventional laser module.

The temperature on the lower face of the second thermo-module 262 rises due to the cooling operation of the second thermo-module 262, but the heat on the lower face of the second thermo-module 262 quickly expands over the whole upper surface of the first thermo-module 261, due to the high thermal conductivity of the thermal conductor 270 located on the lower stage, thereby enabling cooling at high efficiency. Accordingly, the problem in the laser module having the thermo-modules of the conventional two-stage configuration, that is, the heat on the lower face of the second thermo-module 262 locally flows into a part of the upper surface of the first thermo-module 261, can be solved.

In FIG. 20, a third controller 293 controls electric current to be injected to the semiconductor laser device 20 so that the laser output becomes constant, based on a signal output from the first optical detector 41.

As explained above, according to the laser module in the seventh embodiment, the thermal conductor 270 having high thermal conductivity is arranged on the first thermo-module 261 whose temperature is controlled to be constant, and the small-sized second thermo-module 262 is provided between the semiconductor laser device 20 and the thermal conductor 270. Therefore, the temperature control range of the second thermo-module 262 can be expanded, and as a result, the wavelength variable range of the semiconductor laser device can be expanded. Further, the local heat generated by the second thermo-module 262 can be absorbed and dispersed by the thermal conductor 270, and hence temperature adjustment of the semiconductor laser device 20 by the second thermo-module 262 can be performed within a short period of time and with low power consumption. Since the heat flown from the package 101 is also absorbed and dispersed by the thermal conductor 270, heat absorption from the member to be cooled to the second thermo-module 262 becomes possible within a short period of time and with low power consumption.

Since the object whose temperature is to be adjusted by the second thermo-module 262 is limited to the semiconductor laser device 20, the size of the second thermo-module 262 can be made small, and hence the heat flowing from the package 101 to the second thermo-module 262 can be minimized. As a result, quick temperature adjustment and lower power consumption of the semiconductor laser device 20 are realized. In the laser module according to the seventh embodiment, as described above, since heat radiation by the first thermo-module 261 and the second thermo-module 262 can be efficiently performed, a conventional radiation fin is not required, and hence high-density packaging is made possible with other equipment.

In the laser module 200 shown in FIG. 18, one thermal conductor 270 is arranged between the first thermo-module 261 and the second thermo-module 262. However, the thermal conductor may be formed, for example, in multiple stages such that a small thermal conductor is arranged on the thermal conductor 270 and the second thermo-module 262 is arranged on the small thermal conductor. In this case, it is preferable that the thermal conduction ability of the thermal conductor on the lower stage is larger than that of the thermal conductor on the upper stage.

In the temperature control, the second thermo-module 262 may be driven at, for example, a constant current value, and the temperature of the thermal conductor 270 is then changed by the first thermo-module 261, to thereby change the temperature of the semiconductor laser device 20 mounted on the second thermo-module 262. Alternatively, it is also possible to control the drive current for the first thermo-module 261 and the second thermo-module 262 at the same time, to drive these modules under a condition that the power consumption becomes minimum.

FIG. 18 and FIG. 19 show the wavelength monitoring section formed of the prism 51, the optical filter 52, the thermistor 54, the first optical detector 41, and the second optical detector 42. However, the configuration may be such that another beam splitter, for example, a half mirror is arranged instead of the prism 51, and the transmitted light through and the reflected light by the half mirror are received by the first optical detector 41 and the second optical detector 42, respectively provided on separate submounts. Any other known configuration of the wavelength monitor may be adopted.

(Eighth Embodiment)

A laser module according to an eighth embodiment will now be explained. The laser module according to the eighth embodiment is such that in the seventh embodiment, the temperature of the semiconductor laser device 20 is measured and the second thermo-module 262 is controlled based on the measurement result.

Figure 21:
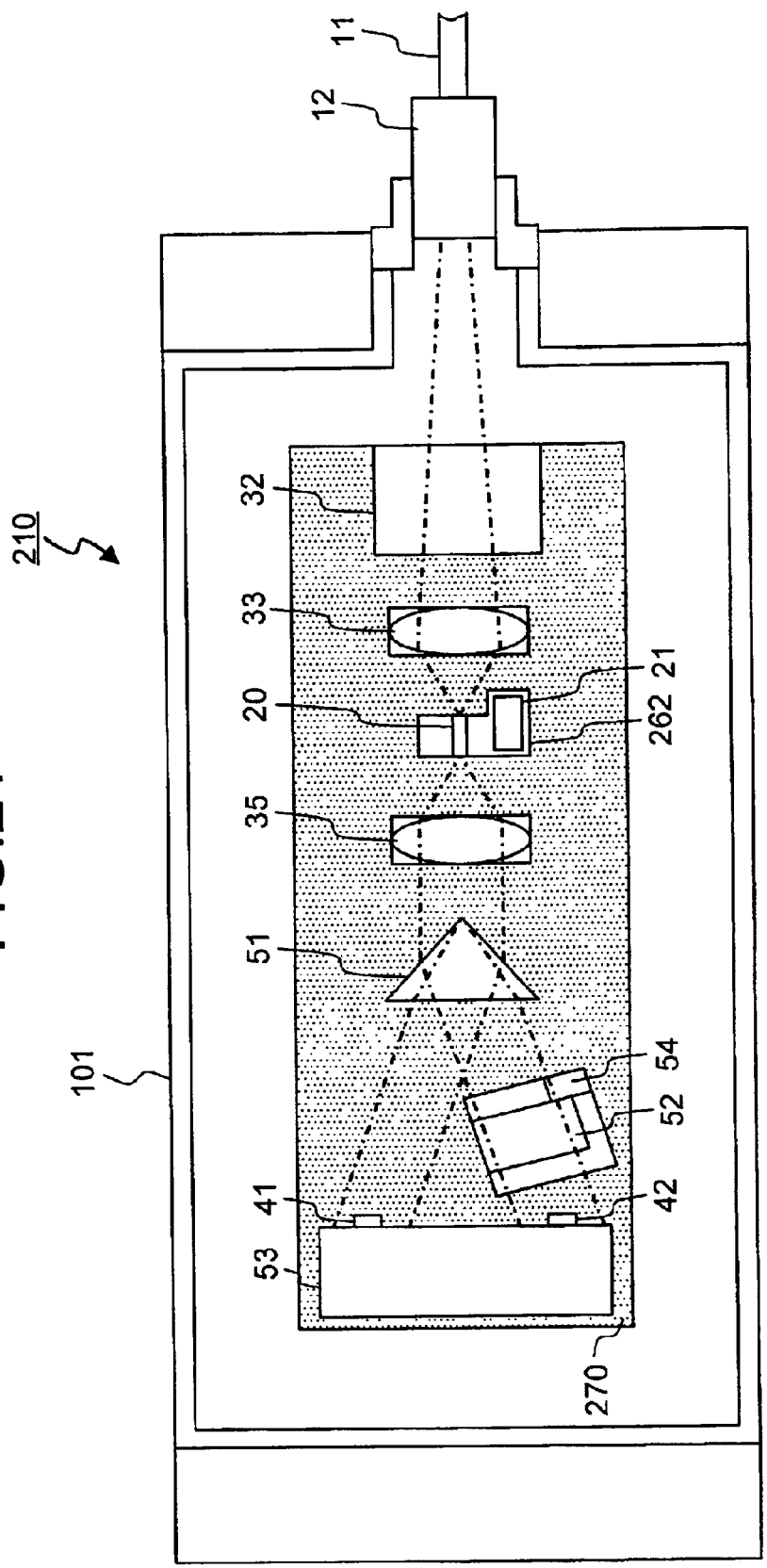
FIG. 21 is a sectional top view of a laser module according to an eighth embodiment in a laser outgoing direction.
Figure 22:
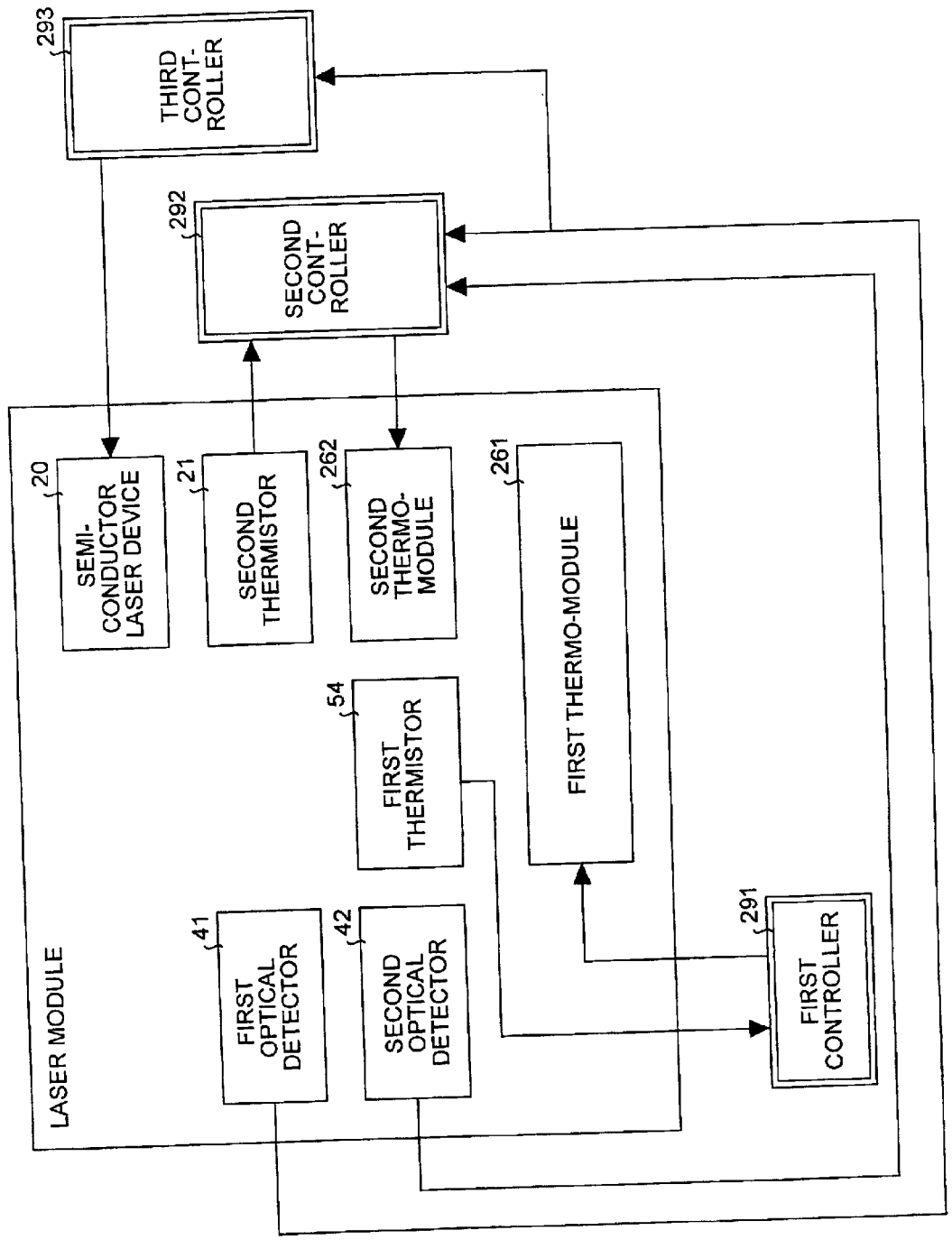
FIG. 22 is an explanatory diagram for explaining the operation of the laser module according to the eighth embodiment.

FIG. 21 is a sectional top view of the laser module according to the eighth embodiment in a laser outgoing direction. FIG. 22 is an explanatory diagram for explaining the operation of the laser module according to the eighth embodiment. In FIG. 21 and FIG. 22, the same reference numerals are assigned to portions common to those in FIG. 19 and FIG. 20, and explanation thereof is omitted. The laser module 210 shown in FIG. 21 is different from the laser module shown in FIG. 19 in that the thermistor 21 for measuring the temperature of the semiconductor laser device 20 is provided on the second thermo-module 262, in addition to the semiconductor laser device 20. In the explanation below, the thermistor 54 for measuring the temperature of the optical filter 52 is referred to as the first thermistor 54, and the thermistor 21 for measuring the temperature of the semiconductor laser device 20 is referred to as the second thermistor 21.

In the diagram shown in FIG. 22, a different point from FIG. 20 is that the second controller 292 receives a signal obtained from the second thermistor 21 as well as signals obtained from the first optical detector 41 and the second optical detector 42. In other words, the second controller 292 receives the signal output from the second thermistor 21, to thereby detect the temperature of the semiconductor laser device 20. The second controller 292 stores the relation between the temperature of the semiconductor laser device 20 and the wavelength to be emitted, and a target temperature is set in advance so that a desired wavelength is selected based on the relation. Accordingly, the second controller 292 controls the second thermo-module 262 so as to reach the target temperature. As explained in the seventh embodiment, the second controller 292 also detects a wavelength deviation based on signals obtained from the first optical detector 41 and the second optical detector 42, to thereby perform fine adjustment to the temperature of the semiconductor laser device 20 based on the deviation. As described above, the temperature of the semiconductor laser device 20 is roughly adjusted first based on the temperature measurement result obtained from the second thermistor 21, and therefore, fine adjustment thereof based on signals obtained from the first optical detector 41 and the second optical detector 42 can be lessened, thereby enabling quick wavelength locking.

As explained above, according to the laser module in the eighth embodiment, the configuration featuring in the seventh embodiment, that is, the thermal conductor 270 having high thermal conductivity is arranged between the first thermo-module 261 and the second thermo-module 262, can be also applied to the configuration in which wavelength locking is carried out based on the measurement result of temperature of the semiconductor laser device 20, and hence the similar effect to that obtained by the seventh embodiment can be also obtained here.

(Ninth Embodiment)

A laser module according to a ninth embodiment will now be explained. The laser module according to the ninth embodiment is such that a thermal conductor having high thermal conductivity is arranged so as to be shared between upper surfaces of thermo-modules arranged side by side in isolation from each other.

Figure 23:
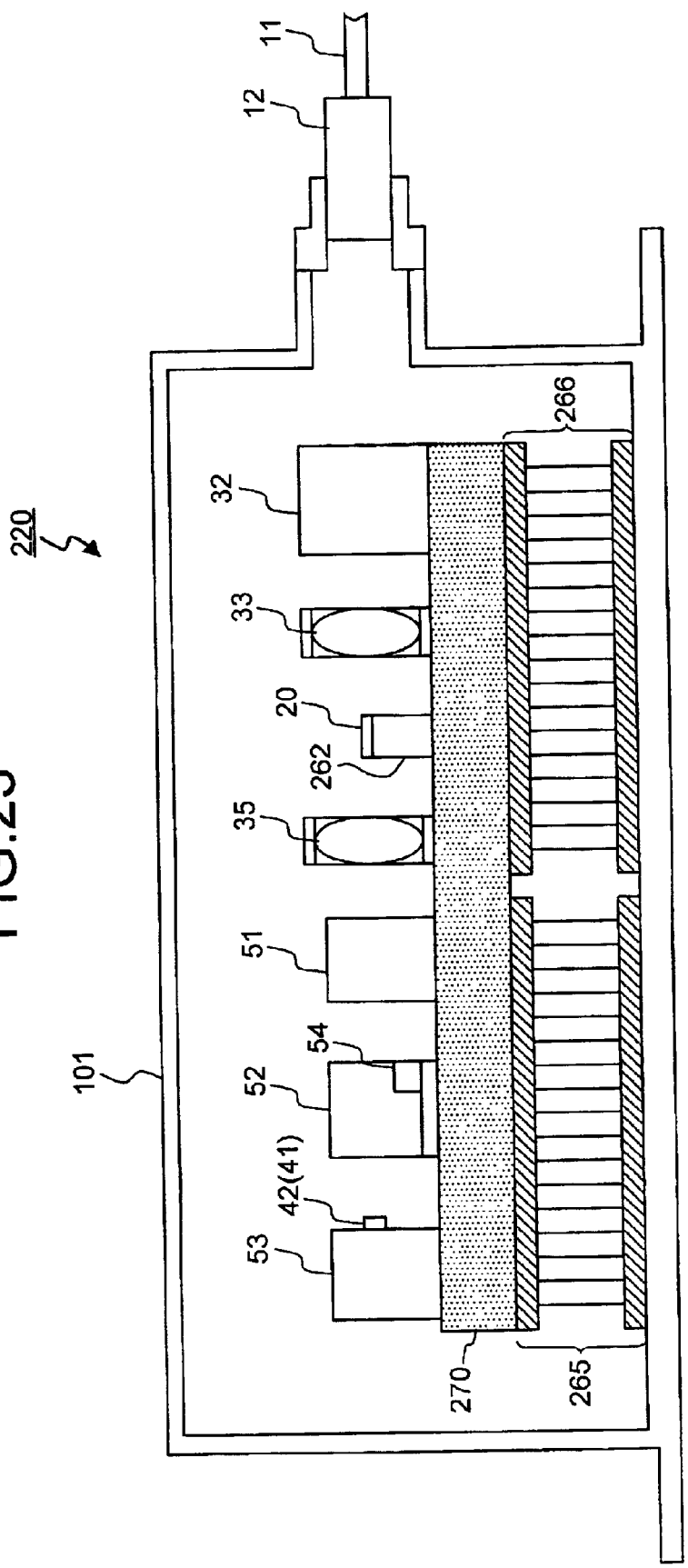
FIG. 23 is a sectional side view of a laser module according to a ninth embodiment in a laser outgoing direction.

FIG. 23 is a sectional side view of the laser module according to the ninth embodiment in a laser outgoing direction. In FIG. 23, the same reference numerals are assigned to portions common to those in FIG. 18, and the explanation thereof is omitted. A laser module 220 shown in FIG. 23 is different from the laser module shown in FIG. 18 in that two thermo-modules 265 and 266 are arranged below the thermal conductor 270. In other words, the thermo-module 265 and the thermo-module 266 show a form in which the first thermo-module 261 shown in FIG. 18 is divided into two.

The advantage of dividing the first thermo-module 261 shown in FIG. 18 into thermo-modules is that a relatively easily available and low-cost standardized thermo-module can be used as thermo-modules that perform temperature adjustment of the second thermo-module 262 and other members to be cooled, via the thermal conductor 270. Since a member arranged between the upper surfaces of the thermo-modules arranged side by side in isolation from each other is the thermal conductor 270 having high thermal conductivity, the thermo-modules can be used as the first thermo-module 261. That is to say, the two thermo-modules 265 and 266 are controlled in common or separately, to appropriately change the temperature of the upper surfaces thereof. The exothermic action and the endothermic action realized by the temperature change thereof are influenced over the second thermo-module 262 and other members to be cooled in a diffused state via the thermal conductor 270 which is a common heat-conduction path. From the viewpoint of the second thermo-module 262 and other members to be cooled, the diffused state can be considered to be equal to the state that one thermo-module is arranged below the thermal conductor 270.

As explained above, according to the laser module in the ninth embodiment, the effects obtained in the seventh embodiment can be also obtained even if the first thermo-module arranged below the thermal conductor 270 is formed of a plurality of thermo-modules.

(Tenth Embodiment)

A laser module according to a tenth embodiment will be explained below. The laser module according to the tenth embodiment is such that, in the laser module shown in the seventh embodiment, a thermal conductor that exerts the same effect as that of the thermal conductor 270, is arranged between the semiconductor laser device 20 and the second thermo-module 262.

In the laser module shown in FIG. 21, the thermistor 21 as well as the semiconductor laser device 20 are arranged on the second thermo-module 262, and therefore the volume of the second thermo-module 262 is larger than that when the thermistor 21 is not necessary as shown in FIG. 19, by the area for arranging the thermistor 21. Therefore, in the second thermo-module 262 shown in FIG. 21, heat locally comes in and comes out of a portion where the semiconductor laser device 20 is arranged. This means that there is a similar problem to one caused in the conventional laser module having thermo-modules in two stages.

In the laser module according to the tenth embodiment, a thermal conductor is arranged between the semiconductor laser device 20 with the thermistor 21 and the second thermo-module 262, in order to solve such a problem occurring when the second thermo-module 262 having a relatively large volume is used, that is, in order to efficiently diffuse the heat generated by the semiconductor laser device 20 over the whole upper surface of the second thermo-module 262.

Figure 24:
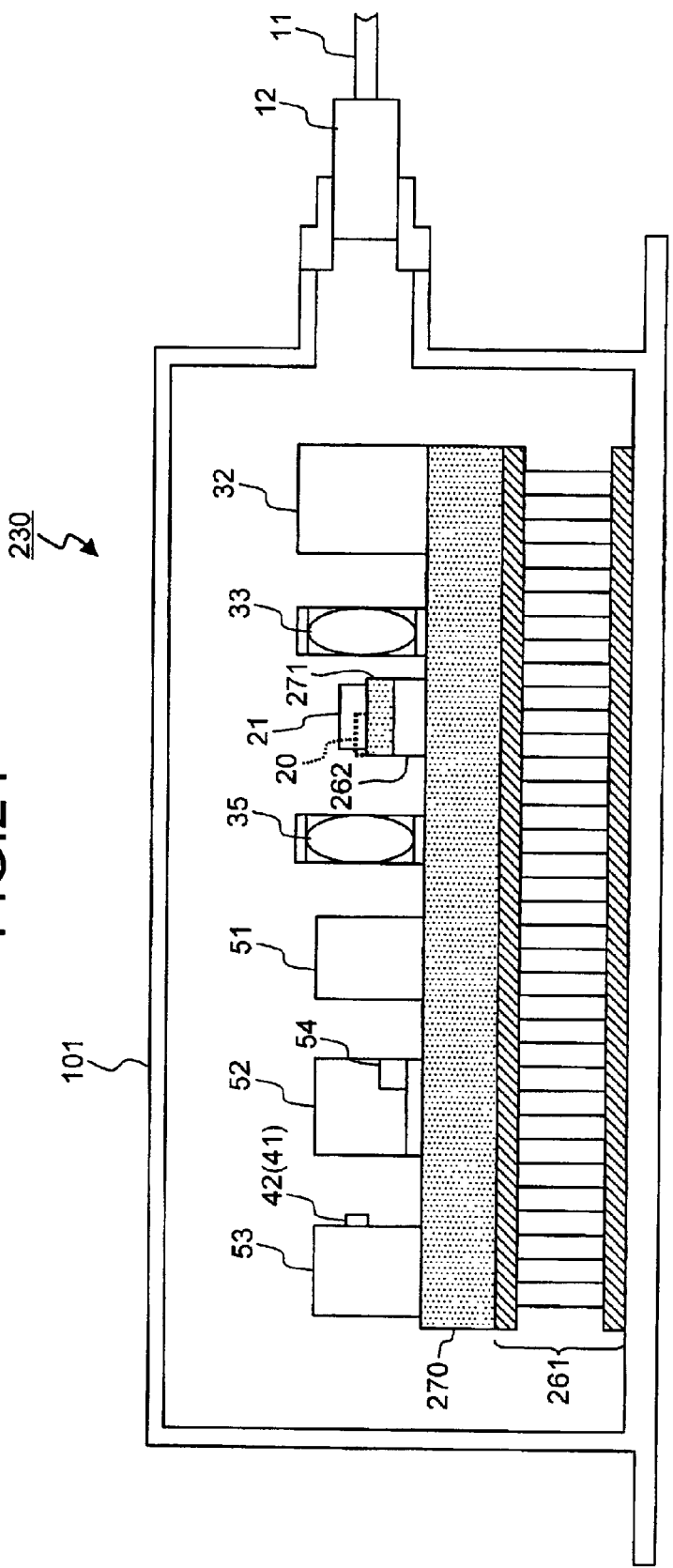
FIG. 24 is a sectional side view of a laser module according to a tenth embodiment in a laser outgoing direction.

FIG. 24 is a sectional side view of the laser module according to the tenth embodiment in a laser outgoing direction. In FIG. 24, the same reference numerals are assigned to portions common to those in FIG. 18 and FIG. 21, and the explanation thereof is omitted. The laser module 230 shown in FIG. 24 is different from those laser modules in FIG. 18 and FIG. 21 in that a thermal conductor 271 is provided between the semiconductor laser device 20 and the second thermo-module 262. The thermal conductor 271 is a member having high thermal conductivity formed of the same material as that of the thermal conductor 270 explained in the seventh embodiment.

In the laser module 230 shown in FIG. 24, the thermistor 21 is arranged on the thermal conductor 271, in addition to the semiconductor laser device 20. That is to say, the thermal conductor 271 has a shape having an area for arranging the thermistor 21 in addition to the semiconductor laser device 20, like the second thermo-module 262 shown in FIG. 21. However, in the form that does not require the thermistor 21 like the seventh embodiment, the thermal conductor 271 may have a shape in which only the semiconductor laser device 20 can be arranged, like the second thermo-module 262 shown in FIG. 19.

As explained above, according to the laser module in the tenth embodiment, the thermal conductor 271 having high thermal conductivity is arranged between the semiconductor laser device 20 and the second thermo-module 262, in addition to the configuration shown in the eighth embodiment. Therefore, the effect due to the eighth embodiment can be also obtained, and the heat generated by the semiconductor laser device 20 can be diffused over the entire upper surface of the second thermo-module 262. As a result, the temperature adjustment of the semiconductor laser device 20 can be carried out within a short period of time, and power consumption of the second thermo-module 262 can be reduced.

(Eleventh Embodiment)

A laser module according to an eleventh embodiment will be explained below. The laser module according to the eleventh embodiment is provided based on the laser module having the conventional two-stage thermo-modules. When a structure in which a thermo-module for directly adjusting the temperature of the semiconductor laser device is further arranged on the upper thermo-module, is adopted, a thermal conductor having high thermal conductivity is arranged between the thermo-module and the upper-stage thermo-module.

Figure 25:
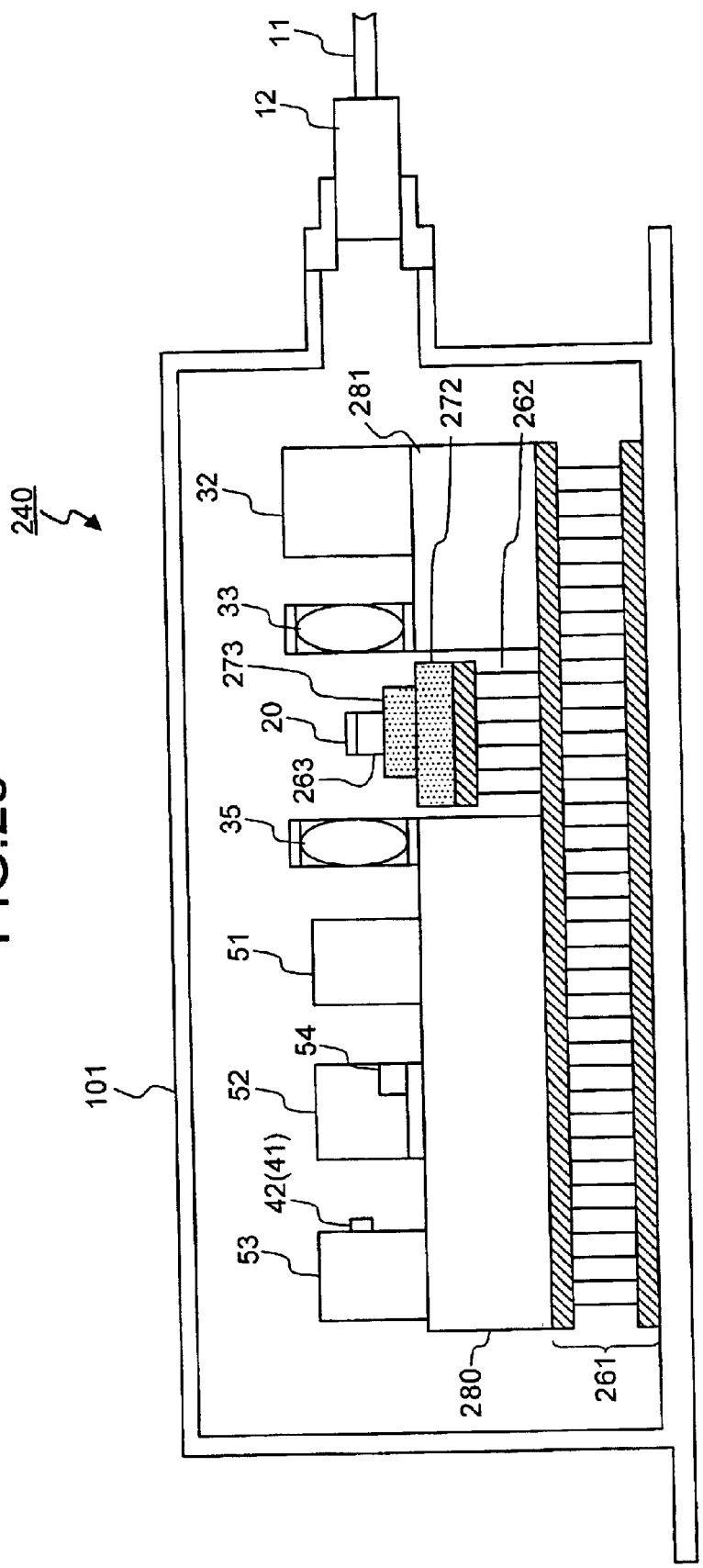
FIG. 25 is a sectional side view of a laser module according to an eleventh embodiment in a laser outgoing direction.

FIG. 25 is a sectional side view of the laser module according to the eleventh embodiment in a laser outgoing direction. In FIG. 25, the same reference numerals are assigned to portions common to those in FIG. 28, and the explanation thereof is omitted. In the laser module 240 shown in FIG. 25, the first thermo-module 261, corresponding to the thermo-module on the lower stage in the conventional two-stage thermo-modules, is arranged on the bottom face of the package 101, and the second thermo-module 262, corresponding to the thermo-module on the upper stage in the conventional two-stage thermo-modules, is arranged on the first thermo-module 261. As shown in FIG. 25, a base 280 and a base 281 corresponding to the base included in the conventional laser module are arranged on the first thermo-module 261 so that the second thermo-module 262 is sandwiched by these bases at the front and the back of the module in the laser outgoing direction.

Thermal conductors 272 and 273, which exert the similar effect to that of the thermal conductor 270 explained in the first embodiment, are laminated on the second thermo-module 262 in this order, and a third thermo-module 263 that directly adjusts the temperature of the semiconductor laser device 20, is arranged on the thermal conductor 273 located on the upper stage. The collimator lens 35, the prism 51, the optical filter 52, and the submount 53 shown in FIG. 28 are arranged on the base 280 to constitute the wavelength monitoring section. The focusing lens 33 and the optical isolator 32 are arranged on the base 281. After all, the second thermo-module 262 and the third thermo-module 263 share the semiconductor laser device 20 as an object to be temperature-adjusted.

As explained above, according to the laser module in the eleventh embodiment, in the laser module having the conventional two-stage thermo-modules, a configuration in which the third thermo-module 263 is added on the thermo-module on the upper stage is adopted. Therefore, the temperature control range of the third thermo-module 263 can be made larger than that in the configuration shown in the seventh to tenth embodiments. Further, since the thermal conductors 272 and 273 having high thermal conductivity are arranged between the semiconductor laser device 20 and the third thermo-module 263, the similar effect to that of the seventh embodiment can be obtained between the second thermo-module 262 and the third thermo-module 263.

In FIG. 25, although the thermal conductors 272 and 273 in the two-stage configuration are arranged between the second thermo-module 262 and the third thermo-module 263, only one thermal conductor may be provided.

(Twelfth Embodiment)

A laser module according to a twelfth embodiment will be explained below. The laser module according to the twelfth embodiment is such that, in the laser according to the seventh embodiment, the thermo-module arranged between the thermal conductor 270 and the semiconductor laser device 20 is formed in two stages.

Figure 26:
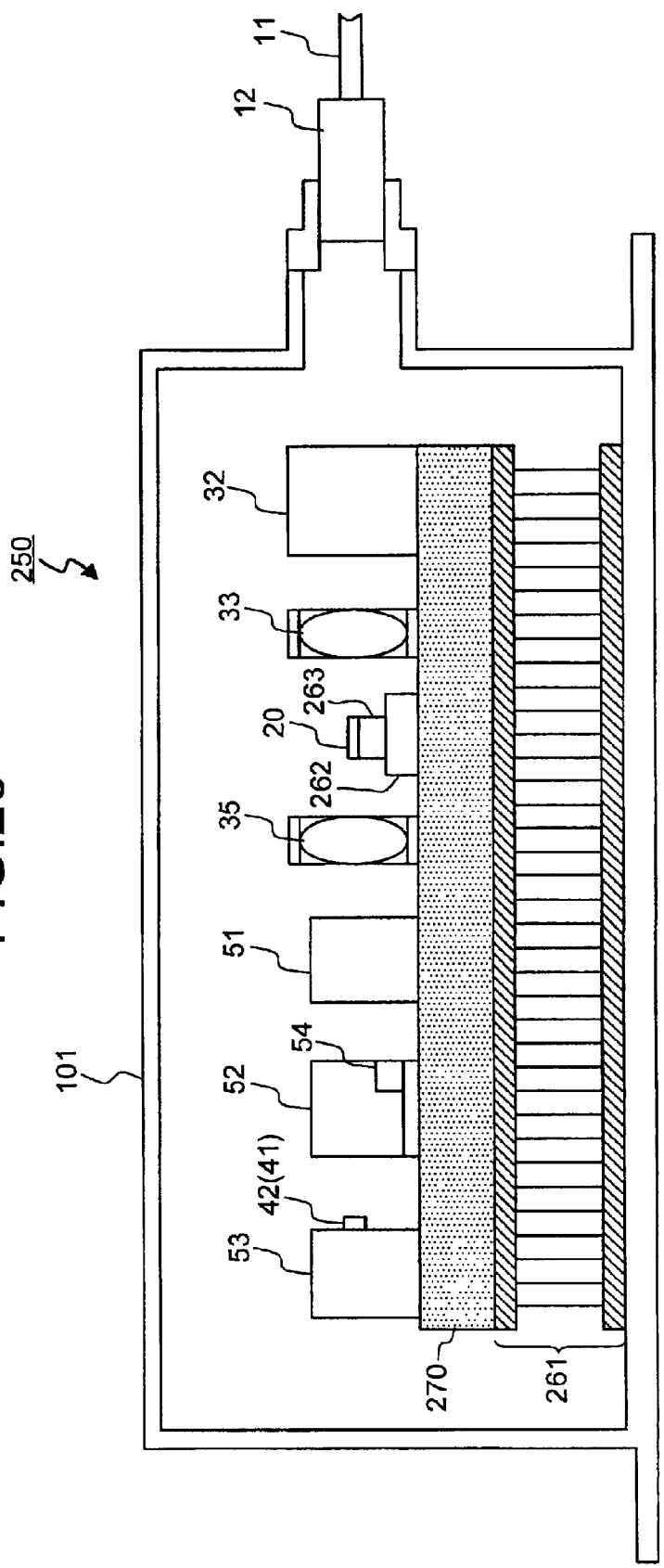
FIG. 26 is a sectional side view of a laser module according to a twelfth embodiment in a laser outgoing direction.

FIG. 26 is a sectional side view of the laser module according to the twelfth embodiment in a laser outgoing direction. In FIG. 26, the same reference numerals are assigned to portions common to those in FIG. 18, and the explanation thereof is omitted. A laser module 250 shown in FIG. 26 is different from the laser module shown in FIG. 18 in that the second thermo-module 262 is arranged on the thermal conductor 270 and a third thermo-module 263 is arranged on the second thermo-module 262 so that the temperature of the semiconductor laser device 20 is directly adjusted by the third thermo-module 263.

That is to say, the twelfth embodiment adopts a form in which the second thermo-module 262 is replaced by two-stage thermo-modules in the laser module shown in the seventh embodiment.

As explained above, according to the laser module in the twelfth embodiment, even when the thermo-module arranged between the thermal conductor 270 and the semiconductor laser device 20 is formed in two stages in the laser module according to the seventh embodiment, the effect due to the first embodiment can be also obtained, in addition to the effect that the temperature control range can be expanded by the two-stage thermo-modules.

(Thirteenth Embodiment)

A laser module according to a thirteenth embodiment will be explained below. The laser module according to the thirteenth embodiment is such that one-stage thermo-module and two-stage thermo-modules are arranged on the bottom of the package, the one-stage thermo-module controls the temperature of the wavelength monitoring section, and another thermo-module is arranged on the two-stage thermo-modules via a thermal conductor having high thermal conductivity, and the temperature of the semiconductor laser device 20 is controlled directly by the another thermo-module.

Figure 27:
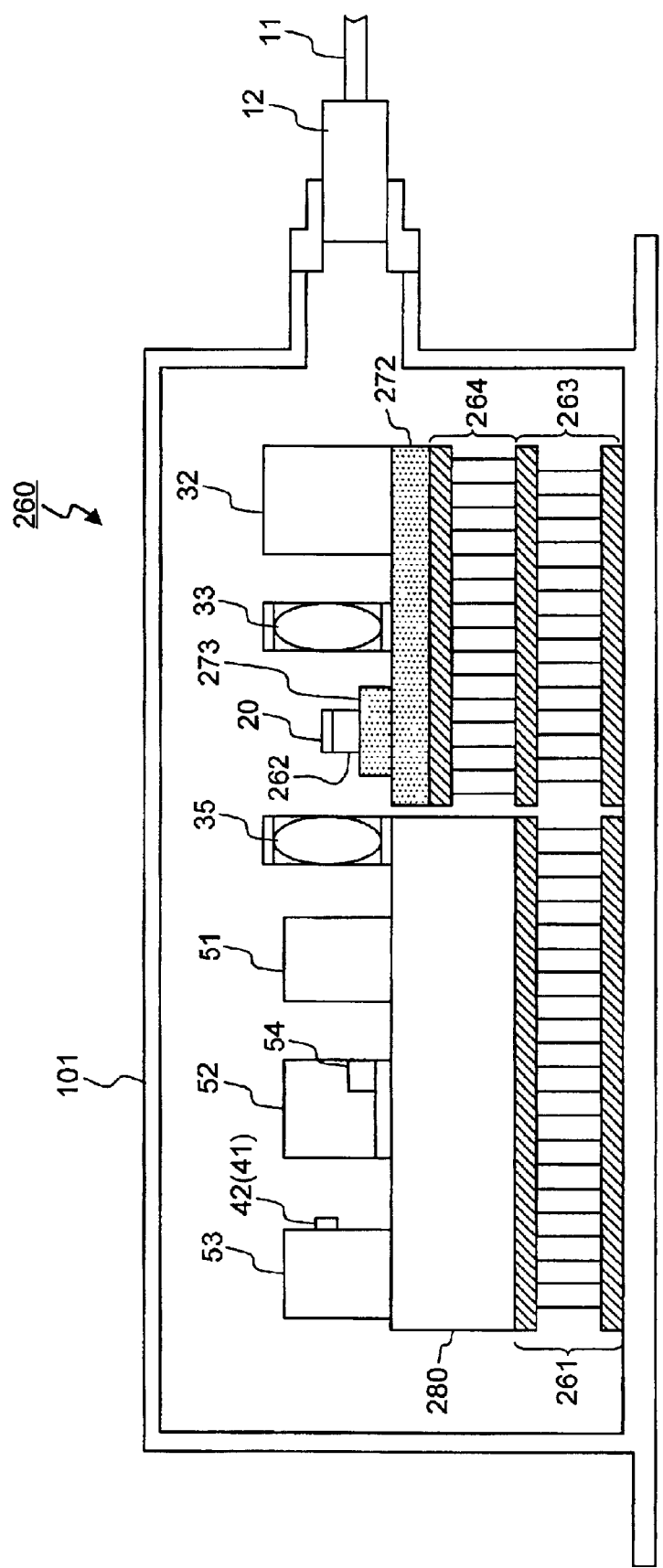
FIG. 27 is a sectional side view of a laser module according to a thirteenth embodiment in a laser outgoing direction.

FIG. 27 is a sectional side view of the laser module according to the thirteenth embodiment in a laser outgoing direction. In FIG. 27, the same reference numerals are assigned to portions common to those in FIG. 28, and the explanation thereof is omitted. In the laser module 260 shown in FIG. 27, the first thermo-module 261 and the second thermo-module 263 are arranged on the bottom of the package 101, parallel with each other. The base 280 corresponding to the base included in the conventional laser module is arranged on the first thermo-module 261. The collimator lens 35, the prism 51, the optical filter 52, and the submount 53 shown in FIG. 28 are arranged on the base 280 to constitute the wavelength monitoring section.

On the other hand, a third thermo-module 264 is further arranged on the second thermo-module 263, and the second thermo-module 263 and the third thermo-module 264 constitute the conventional two-stage thermo-modules. The thermal conductor 272 is arranged on the whole surface of the third thermo-module 264 corresponding to the upper stage in the two-stage configuration. As shown in FIG. 27, the other conductor 273, the focusing lens 33, and the optical isolator 32 are further arranged on the thermal conductor 272. A fourth thermo-module 262 is arranged on the thermal conductor 273, and the semiconductor laser device 20 is arranged on the fourth thermo-module 262.

In other words, the laser module 260 has a configuration such that, in the configuration of the laser module explained in the eleventh embodiment, the first thermo-module 261 is divided into the wavelength monitoring section side and the laser section side, the base 281 is excluded, and the thermal conductor 273 is added on the thermal conductor 272 on the laser section side to arrange the focusing lens 33 and the optical isolator 32 thereon.

Therefore, on the laser section side, the effect explained in the eleventh embodiment is exerted to obtain the same effect. On the other hand, the first thermo-module 261 is used only for controlling the temperature of the wavelength monitoring section. In this point, the same action and effect as the second thermo-module 69 in the conventional laser module shown in FIG. 28 can be obtained.

As explained above, according to the laser module in the thirteenth embodiment, the wavelength monitoring section and the laser section are temperature-controlled by different thermo-modules. In the laser section, the same effect as in the seventh embodiment can be obtained, by the existence of the thermal conductors 272 and 273 arranged between the fourth thermo-module 262 and the third thermo-module 264.

In the configuration explained in this thirteenth embodiment, only the semiconductor laser device 20 on the small fourth thermo-module 262 is temperature-controlled in a wide range, and a temperature change on the third thermo-module 264 becomes smaller than that on the fourth thermo-module 262. Since the characteristic of the optical parts arranged on the third thermo-module 264 changes depending on temperature, in the end, the characteristic change of these optical parts can be reduced.

In the configuration explained in the thirteenth embodiment, the second thermo-module 263, the third thermo-module 264, and the fourth thermo-module 262 may be serially connected to be controlled, as an apparently integral thermo-module, by the second controller based on the values of the optical detectors 41 and 42 in the wavelength monitoring section. With this configuration, the input-output terminals of the thermo-modules laminated in numbers can be shared, and hence the number of terminals to be used can be reduced, and control becomes easy.

In the thirteenth embodiment, as shown in FIG. 27, the thermistor 21 may be arranged on the thermal conductor 273 provided on the third thermo-module 264, and the second thermo-module 263 and the third thermo-module 264 may be electrically connected to be controlled, as an apparently integral thermo-module, based on the value of the thermistor 21. The temperature of the semiconductor laser device 20 on the fourth thermo-module 262 can be controlled at a predetermined temperature by the value of the thermistor 21 and the value of the current passed to the fourth thermo-module 262.

It is clear that any laser module having a construction other than these shown herein can be provided by appropriately combining the positional relations between each of the thermo-modules and each of the thermal conductors in the seventh to thirteenth embodiments explained above.

As explained above, according to the laser module in the present invention, it is advantageously possible to realize such a laser module that stable wavelength locking is made possible by a wavelength monitor using an optical filter, the variable range of the emission wavelength can be expanded by expanding the temperature controllable range of the semiconductor laser device, and a large number of emission wavelengths can be selected. Further, it is advantageously possible to improve the function of the optical transmitter and the optical communication system in which this laser module is used by making it possible to select the wavelengths and realizing the wavelength locking at a predetermined wavelength.

According to the laser module in the present invention, since an insulating or thermal insulating member is filled between the second temperature adjuster and the part arranged parallel each other nearby, electric short or unnecessary heat conduction between these components can be prevented. As a result, it is advantageously possible to realize the operation with high reliability and reduction in power consumption of the second temperature adjuster.

According to the laser module in the present invention, the thermal conductor having high thermal conductivity is arranged on the first temperature adjuster whose temperature is controlled to be constant, and the second temperature adjuster is arranged between the semiconductor laser device and the thermal conductor. Therefore, the temperature control range of the second temperature adjuster can be expanded, and as a result, the wavelength variable range of the semiconductor laser device can be expanded. Further, the heat locally generated by the second temperature adjuster is radiated by the thermal conductor, and hence temperature adjustment of the semiconductor laser device by the first and second temperature adjusters becomes possible within a short period of time and with low power consumption, and heat flowing in from the outside can be absorbed and dispersed by the thermal conductor. As a result, it is advantageously possible to perform heat absorption from the member to be cooled to the second temperature adjuster within a short period of time and with low power consumption.

According to the laser module in the present invention, since another conductor having high thermal conductivity is provided between the semiconductor laser device and the second temperature adjuster, the heat locally generated by the semiconductor laser device is radiated by the another conductor. As a result, it is advantageously possible to perform temperature adjustment of the semiconductor laser device by the second temperature adjuster within a short period of time and with low power consumption.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A laser module comprising:
   a first controllable temperature adjuster;
   a second controllable temperature adjuster provided on the first controllable temperature adjuster and having an element with an active temperature controlling function;
   a semiconductor laser device provided on the second controllable temperature adjuster; and
   a wavelength monitoring section that is provided on the first controllable temperature adjuster, and detects a change in wavelength of a laser beam output from the semiconductor laser device.

2. The laser module according to claim 1, wherein the first controllable temperature adjuster controls the temperature of the wavelength monitoring section at a constant temperature, and the second controllable temperature adjuster controls the temperature of the semiconductor laser device so that the wavelength of the laser beam output from the semiconductor laser device is set to a predetermined value.

3. The laser module according to claim 1, wherein the wavelength monitoring section comprises a temperature measurer for wavelength monitoring, which measures the temperature of the wavelength monitoring section; and
   the first controllable temperature adjuster is temperature-controlled so that the temperature thereof becomes constant, based on the measurement result by the temperature measurer for wavelength monitoring.

4. The laser module according to claim 1, wherein a member having insulation or thermal insulation is filled between the second controllable temperature adjuster and the wavelength monitoring section.

5. The laser module according to claim 1, comprising an optical isolator provided on the first controllable temperature adjuster and on the laser outgoing side of the semiconductor laser device.

6. The laser module according to claim 1, wherein the second controllable temperature adjuster is temperature-controlled so as to suppress the change in the wavelength, based on the detection result of the wavelength change by the wavelength monitoring section.

7. The laser module according to claim 1, wherein the second controllable temperature adjuster controls the temperature of the semiconductor laser device so that the wavelength of the laser beam output from the semiconductor laser device is set to a predetermined value, based on only the detection result of the wavelength change by the wavelength monitoring section.

8. The laser module according to claim 1, comprising a temperature measurer for the semiconductor laser device that measures the temperature of the semiconductor laser device, wherein the second controllable temperature adjuster controls the temperature of the semiconductor laser device so that the wavelength of the laser beam output from the semiconductor laser device is set to a predetermined value, based on the measurement result by the temperature measurer for the semiconductor laser device and the detection result of the wavelength change by the wavelength monitoring section.

9. The laser module according to claim 1, wherein the wavelength monitoring section comprises:
   a prism that splits a rearward beam emitted from the semiconductor laser device into two directions;
   a first optical detector that receives one of the beams split by the prism;
   an optical filter into which the other of the beams split by the prism enters; and
   a second optical detector that receives the beam passing through the optical filter,
   wherein a change in wavelength of the laser beam output from the semiconductor laser device is detected based on the detection result by the first optical detector and the detection result by the second optical detector.

10. The laser module according to claim 1, wherein the wavelength monitoring section comprises:
    a first beam splitter into which a forward beam or a rearward beam emitted from the semiconductor laser device enters;
    a second beam splitter into which a forward beam or a rearward beam emitted from the semiconductor laser device enters;
    a first optical detector that receives the beam reflected by the first beam splitter;
    an optical filter into which the beam reflected by the second beam splitter enters; and
    a second optical detector that receives the beam passing through the optical filter,
    wherein a change in wavelength of the laser beam output from the semiconductor laser device is detected based on the detection result by the first optical detector and the detection result by the second optical detector.

11. A laser module comprising:
    a first controllable temperature adjuster;
    a second controllable temperature adjuster provided on the first controllable temperature adjuster, said second controllable temperature adjuster including a heater and having an element with an active temperature controlling function;
    a semiconductor laser device provided on the second controllable temperature adjuster, and
    a wavelength monitoring section that is provided on the first controllable temperature adjuster, and detects a change in wavelength of a laser beam output from the semiconductor laser device.

12. The laser module according to claim 11, wherein the first controllable temperature adjuster controls the temperature of the wavelength monitoring section at a constant temperature, and the second controllable temperature adjuster controls the temperature of the semiconductor laser device so that the wavelength of the laser beam output from the semiconductor laser device is set to a predetermined value.

13. The laser module according to claim 11, wherein the wavelength monitoring section comprises a temperature measurer for wavelength monitoring, which measures the temperature of the wavelength monitoring section; and
    the first controllable temperature adjuster is temperature-controlled so that the temperature thereof becomes constant, based on the measurement result by the temperature measurer for wavelength monitoring.

14. The laser module according to claim 11, wherein a member having insulation or thermal insulation is filled between the second controllable temperature adjuster and the wavelength monitoring section.

15. The laser module according to claim 11, comprising an optical isolator provided on the first controllable temperature adjuster and on the laser outgoing side of the semiconductor laser device.

16. The laser module according to claim 11, wherein the second controllable temperature adjuster is temperature-controlled so as to suppress the change in the wavelength, based on the detection result of the wavelength change by the wavelength monitoring section.

17. The laser module according to claim 11, wherein the second controllable temperature adjuster controls the temperature of the semiconductor laser device so that the wavelength of the laser beam output from the semiconductor laser device is set to a predetermined value, based on only the detection result of the wavelength change by the wavelength monitoring section.

18. The laser module according to claim 11, comprising a temperature measurer for the semiconductor laser device that measures the temperature of the semiconductor laser device,
wherein the second controllable temperature adjuster controls the temperature of the semiconductor laser device so that the wavelength of the laser beam output from the semiconductor laser device is set to a predetermined value, based on the measurement result by the temperature measurer for the semiconductor laser device and the detection result of the wavelength change by the wavelength monitoring section.

19. The laser module according to claim 11, wherein the wavelength monitoring section comprises:
a prism that splits a rearward beam emitted from the semiconductor laser device into two directions;
a first optical detector that receives one of the beams split by the prism;
an optical filter into which the other of the beams split by the prism enters; and
a second optical detector that receives the beam passing through the optical filter,
wherein a change in wavelength of the laser beam output from the semiconductor laser device is detected based on the detection result by the first optical detector and the detection result by the second optical detector.

20. The laser module according to claim 11, wherein the wavelength monitoring section comprises:
a first beam splitter into which a forward beam or a rearward beam emitted from the semiconductor laser device enters;
a second beam splitter into which a forward beam or a rearward beam emitted from the semiconductor laser device enters;
a first optical detector that receives the beam reflected by the first beam splitter;
an optical filter into which the beam reflected by the second beam splitter enters; and
a second optical detector that receives the beam passing through the optical filter,
wherein a change in wavelength of the laser beam output from the semiconductor laser device is detected based on the detection result by the first optical detector and the detection result by the second optical detector.

21. A laser module comprising:
a first controllable temperature adjuster;
a second controllable temperature adjuster provided on the first controllable temperature adjuster and having an element with an active temperature controlling function;
a third controllable temperature adjuster arranged side by side in isolation from the first controllable temperature adjuster;
a semiconductor laser device provided on the second controllable temperature adjuster; and
a wavelength monitoring section that is provided on the third controllable temperature adjuster, and detects a change in wavelength of a laser beam output from the semiconductor laser device.

22. The laser module according to claim 21, wherein the first controllable temperature adjuster is controlled at a predetermined constant temperature, and the second controllable temperature adjuster controls the temperature of the semiconductor laser device so that the wavelength of the laser beam output from the semiconductor laser device is set to a predetermined value, and the third temperature adjuster controls the wavelength monitoring section at a constant temperature.

23. The laser module according to claim 21, wherein the wavelength monitoring section comprises a temperature measurer for wavelength monitoring, which measures the temperature of the wavelength monitoring section; and
the third controllable temperature adjuster is temperature-controlled so that the temperature thereof becomes constant, based on the measurement result by the temperature measurer for wavelength monitoring.

24. The laser module according to claim 21, wherein the first controllable temperature adjuster and the second controllable temperature adjuster are electrically connected, and are controlled so that the adjusters, as an apparently integral controllable temperature adjuster, set the wavelength of the laser beam to a predetermined value, and
the third controllable temperature adjuster controls the wavelength monitoring section at a constant temperature.

25. The laser module according to claim 21, wherein a member having insulation or thermal insulation is filled between the second controllable temperature adjuster and the wavelength monitoring section.

26. The laser module according to claim 21, comprising an optical isolator provided on the first controllable temperature adjuster and on the laser outgoing side of the semiconductor laser device.

27. The laser module according to claim 21, wherein the second controllable temperature adjuster is temperature-controlled so as to suppress the change in the wavelength, based on the detection result of the wavelength change by the wavelength monitoring section.

28. The laser module according to claim 21, wherein the second controllable temperature adjuster controls the temperature of the semiconductor laser device so that the wavelength of the laser beam output from the semiconductor laser device is set to a predetermined value, based on only the detection result of the wavelength change by the wavelength monitoring section.

29. The laser module according to claim 21, comprising a temperature measurer for the semiconductor laser device that measures the temperature of the semiconductor laser device,
wherein the second controllable temperature adjuster controls the temperature of the semiconductor laser device so that the wavelength of the laser beam output from the semiconductor laser device is set to a predetermined value, based on the measurement result by the temperature measurer for the semiconductor laser device and the detection result of the wavelength change by the wavelength monitoring section.

30. The laser module according to claim 21, wherein the wavelength monitoring section comprises:
a prism that splits a rearward beam emitted from the semiconductor laser device into two directions;

a first optical detector that receives one of the beams split by the prism;

an optical filter into which the other of the beams split by the prism enters; and a second optical detector that receives the beam passing through the optical filter, wherein a change in wavelength of the laser beam output from the semiconductor laser device is detected based on the detection result by the first optical detector and the detection result by the second optical detector.

31. The laser module according to claim 21, wherein the wavelength monitoring section comprises:

a first beam splitter into which a forward beam or a rearward beam emitted from the semiconductor laser device enters;

a second beam splitter into which a forward beam or a rearward beam emitted from the semiconductor laser device enters;

a first optical detector that receives the beam reflected by the first beam splitter;

an optical filter into which the beam reflected by the second beam splitter enters; and a second optical detector that receives the beam passing through the optical filter, wherein a change in wavelength of the laser beam output from the semiconductor laser device is detected based on the detection result by the first optical detector and the detection result by the second optical detector.

32. A laser module comprising:

a first controllable temperature adjuster;

a thermal conductor having high thermal conductivity, which is provided on the first controllable temperature adjuster;

a second controllable temperature adjuster provided on the thermal conductor and having an element with an active temperature controlling function; and a semiconductor laser device provided on the second controllable temperature adjuster.

33. The laser module according to claim 32, comprising a temperature measurer that is provided on the second controllable temperature adjuster, and measures the temperature of the semiconductor laser device.

34. The laser module according to claim 32, comprising another thermal conductor having high thermal conductivity, which is arranged between the second controllable temperature adjuster and the semiconductor laser device.

35. The laser module according to claim 34, comprising a temperature measurer that is provided on the another thermal conductor, and measures the temperature of the semiconductor laser device.

36. The laser module according to claim 32, wherein the first controllable temperature adjuster is formed of a plurality of controllable temperature adjusters arranged side by side in isolation from each other, and the thermal conductor is arranged so as to be shared between the respective controllable temperature adjusters.

37. The laser module according to claim 32, wherein the first controllable temperature adjuster is formed of a plurality of controllable temperature adjusters having a relation of a lower stage and an upper stage.

38. The laser module according to claim 37, comprising a wavelength monitoring section that is provided on the controllable temperature adjuster located on the lower stage of the first controllable temperature adjuster, and detects a change in wavelength of laser beams output from the semiconductor laser device.

39. The laser module according to claim 32, comprising a wavelength monitoring section that is provided on the thermal conductor, and detects a change in wavelength of laser beams output from the semiconductor laser device.

40. The laser module according to claim 32, wherein the second controllable temperature adjuster is formed of a plurality of controllable temperature adjusters having a relation of a lower stage and an upper stage.

41. The laser module according to claim 40, wherein the temperature adjusting ability of the controllable temperature adjuster located on the upper stage is lower than that of the controllable temperature adjuster located on the lower stage.

42. The laser module according to claim 32, wherein the thermal conductor is formed of a plurality of thermal conductors having a relation of a lower stage and an upper stage.

43. The laser module according to claim 42, wherein the thermal conducting ability of the thermal conductor located on the upper stage is lower than that of the thermal conductor located on the lower stage.

44. The laser module according to claim 32, wherein the thermal conductor has a thermal conductivity of 130 W/m.K or higher.

45. The laser module according to claim 32, wherein the thermal conductor has a thickness of at least 100 $\mu$m.

46. The laser module according to claim 32, wherein the first controllable temperature adjuster and the second controllable temperature adjuster are electrically connected, and are controlled so that the adjusters, as an apparently integral controllable temperature adjuster, set the wavelength of a laser beam to a predetermined value.

47. The laser module according to claim 32, wherein the temperature of the semiconductor laser device is estimated and controlled based on the measurement result by the temperature measurer provided on the first controllable temperature adjuster and a value of current passed to the second controllable temperature adjuster.

* * * * *